United States Patent
Kato

(10) Patent No.: US 10,276,612 B2
(45) Date of Patent: Apr. 30, 2019

(54) PHOTOELECTRIC CONVERSION APPARATUS AND IMAGE PICKUP SYSTEM

(71) Applicant: CANON KABUSHIKI KAISHA, Tokyo (JP)

(72) Inventor: Taro Kato, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 345 days.

(21) Appl. No.: 14/724,667

(22) Filed: May 28, 2015

(65) Prior Publication Data
US 2015/0349007 A1 Dec. 3, 2015

(30) Foreign Application Priority Data

Jun. 2, 2014 (JP) ................................. 2014-114434

(51) Int. Cl.
*H01L 27/00* (2006.01)
*H01L 27/146* (2006.01)

(52) U.S. Cl.
CPC .. *H01L 27/14609* (2013.01); *H01L 27/14607* (2013.01); *H01L 27/14627* (2013.01); *H01L 27/14629* (2013.01); *H01L 27/14643* (2013.01)

(58) Field of Classification Search
CPC ......... H01L 27/14607; H01L 27/14609; H01L 27/14627; H01L 27/14629; H01L 27/14643
USPC ........................................ 250/208.1, 227.11
See application file for complete search history.

(56) References Cited

U.S. PATENT DOCUMENTS

| | | | |
|---|---|---|---|
| 7,646,943 B1* | 1/2010 | Wober | G02B 6/421 250/227.11 |
| 8,981,325 B2* | 3/2015 | Aratani | H01L 45/1625 257/2 |
| 2009/0090841 A1* | 4/2009 | Kusaka | G01C 3/08 250/201.2 |
| 2009/0166518 A1 | 7/2009 | Tay et al. | |
| 2010/0200738 A1 | 8/2010 | Yamashita | |
| 2010/0265384 A1 | 10/2010 | Tay et al. | |

(Continued)

FOREIGN PATENT DOCUMENTS

| | | |
|---|---|---|
| CN | 102637711 A | 8/2012 |
| GB | 2481651 A | 1/2012 |

(Continued)

*Primary Examiner* — Thanh Luu
*Assistant Examiner* — Kevin Wyatt
(74) *Attorney, Agent, or Firm* — Canon USA Inc., IP Division

(57) ABSTRACT

A photoelectric conversion apparatus including a light-receiving element, including: a plurality of photoelectric conversion portions; a separating portion located between the plurality of photoelectric conversion portions; and a light guide portion surrounded by an insulation film including at least one insulation layer and provided so as to extend over the plurality of photoelectric conversion portions, and the light guide portion includes: a high refractive index part having a refractive index higher than a refractive index of the insulation layer; and a low refractive index part having a refractive index higher than the refractive index of the insulation layer and lower than the refractive index of the high refractive index part, and the high refractive index part is located on each of the plurality of photoelectric conversion portions and the low refractive index part is located on the separating portion.

20 Claims, 11 Drawing Sheets

(56) References Cited

U.S. PATENT DOCUMENTS

| | | |
|---|---|---|
| 2010/0302432 A1 | 12/2010 | Komuro |
| 2010/0317142 A1 | 12/2010 | Tay et al. |
| 2011/0031381 A1 | 2/2011 | Tay et al. |
| 2011/0102651 A1 | 5/2011 | Tay et al. |
| 2011/0242350 A1* | 10/2011 | Sawayama ........ H01L 27/14625 348/222.1 |
| 2012/0133809 A1* | 5/2012 | Yamada ............ H01L 27/14623 348/294 |
| 2012/0200727 A1 | 8/2012 | Kato et al. |
| 2012/0200728 A1 | 8/2012 | Kobayashi et al. |
| 2012/0298841 A1* | 11/2012 | Yamashita ........ H01L 27/14623 250/208.1 |
| 2013/0277541 A1* | 10/2013 | Ikemoto ............ H01L 27/14625 250/227.11 |
| 2014/0001589 A1* | 1/2014 | Fukuda ............. H01L 27/14623 257/432 |
| 2014/0118589 A1 | 5/2014 | Numata |
| 2015/0349015 A1 | 12/2015 | Yamaguchi |
| 2017/0092677 A1* | 3/2017 | Ikakura ............. H01L 27/14625 |

FOREIGN PATENT DOCUMENTS

| | | |
|---|---|---|
| JP | 2002-314062 A | 10/2002 |
| JP | 2003-244712 A | 8/2003 |
| JP | 2009-158800 A | 7/2009 |
| JP | 2012-114882 A | 6/2012 |
| JP | 2012-142446 A | 7/2012 |
| JP | 2012-151367 A | 8/2012 |
| JP | 2013-120314 A | 6/2013 |
| JP | 2014-057079 A | 3/2014 |
| JP | 2014-093343 A | 5/2014 |
| JP | 2015-225939 A | 12/2015 |
| RU | 2426195 C1 | 8/2011 |
| WO | 2011/001196 A1 | 1/2011 |

* cited by examiner

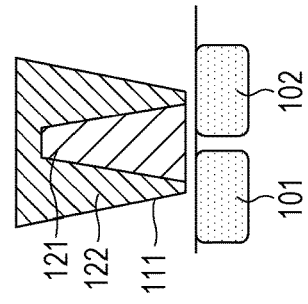
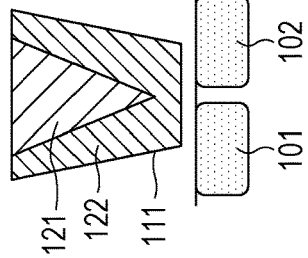
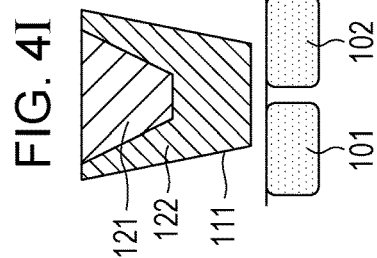
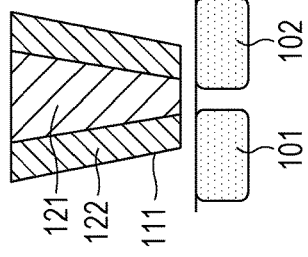
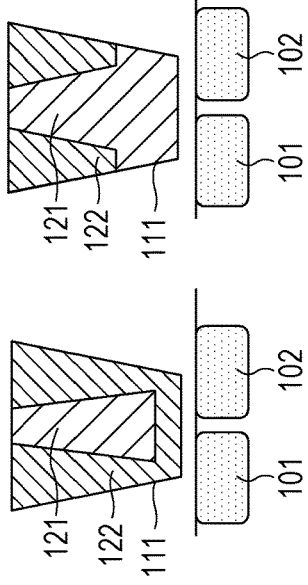
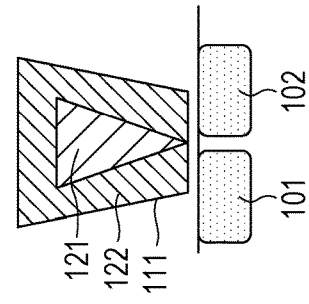
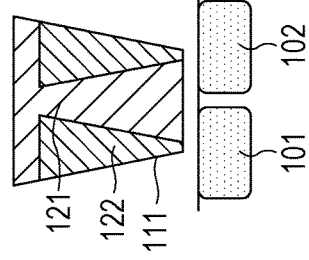

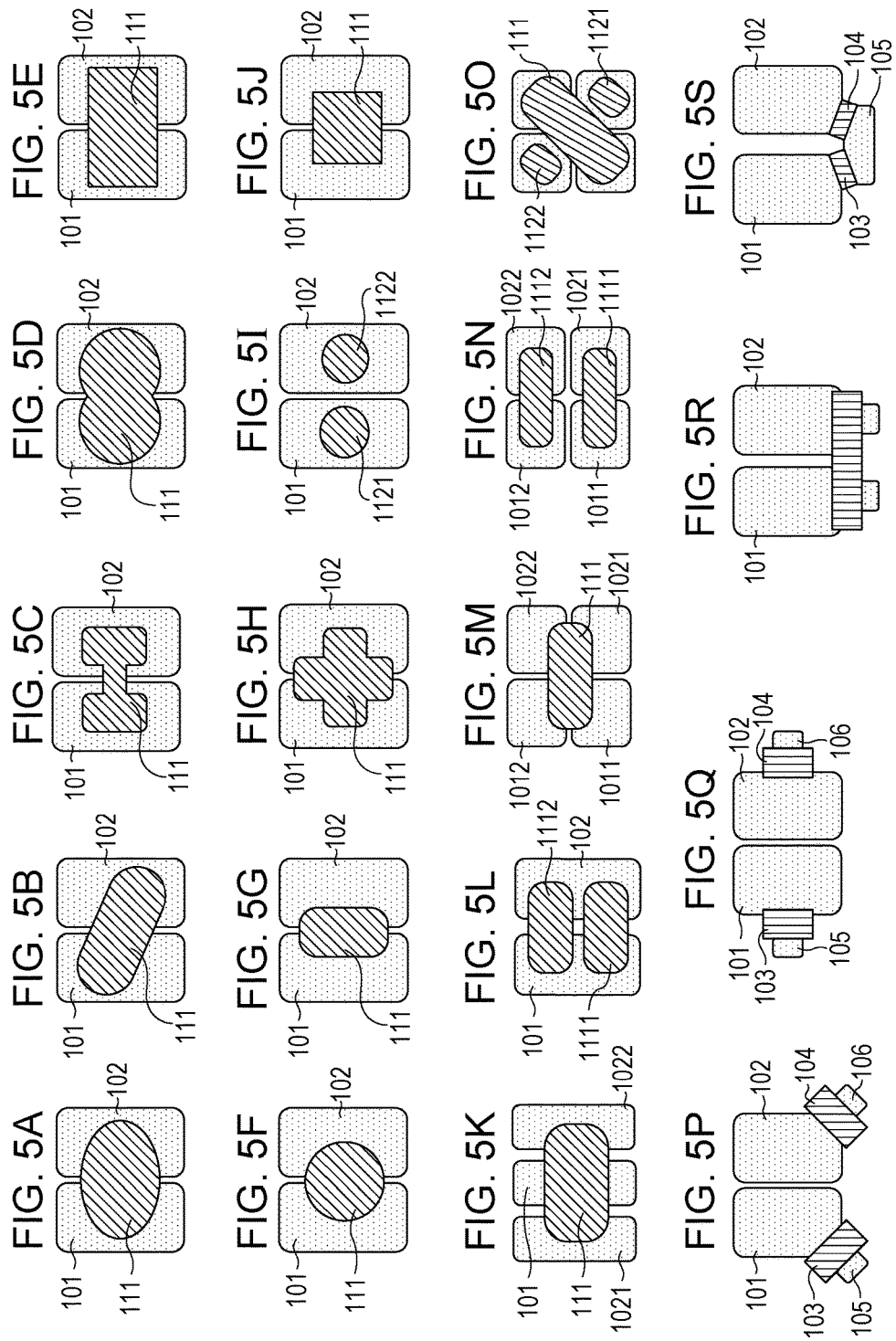

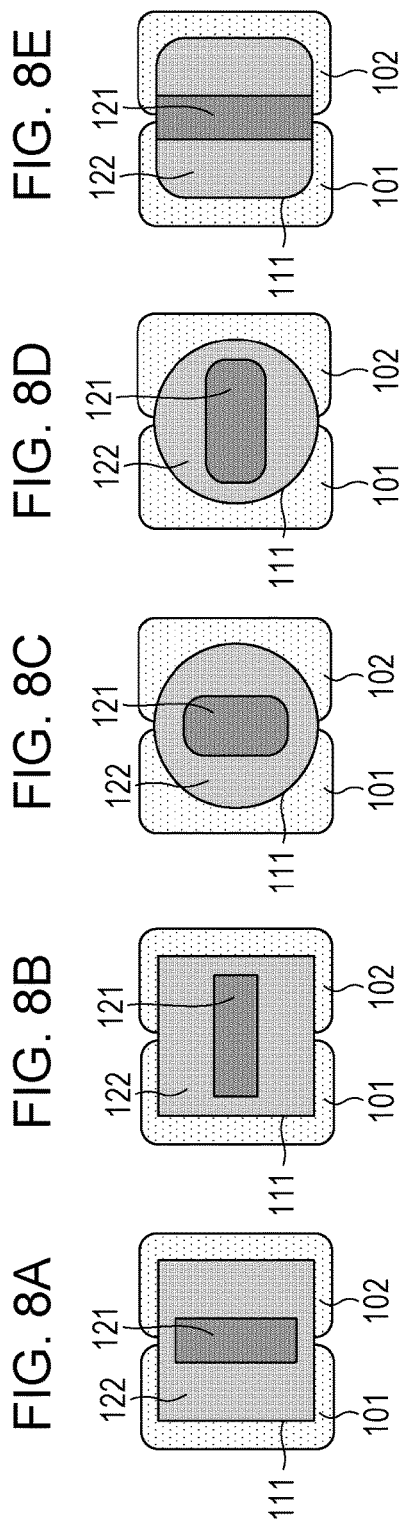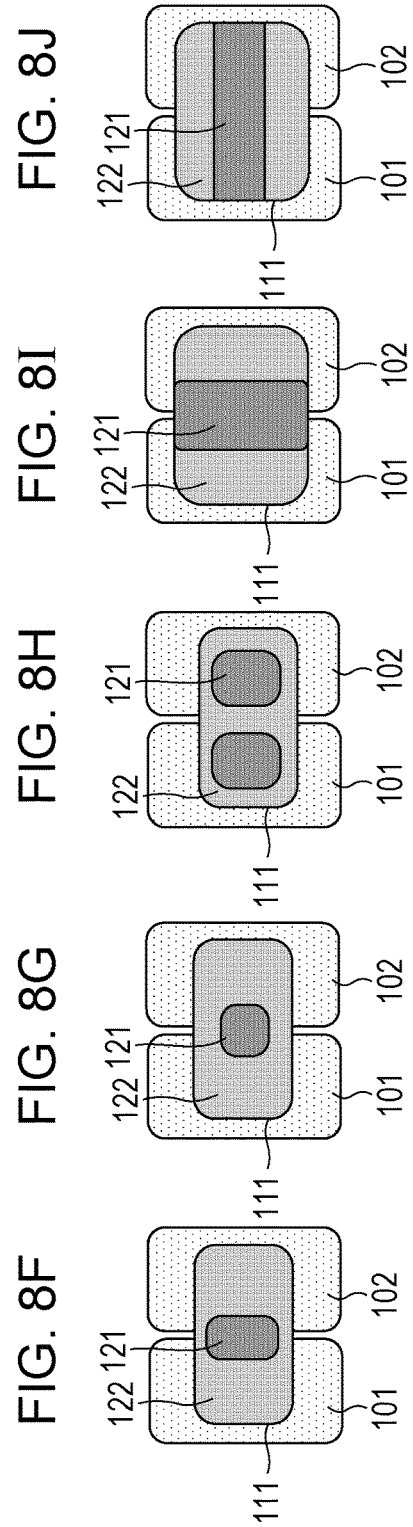

PHOTOELECTRIC CONVERSION APPARATUS AND IMAGE PICKUP SYSTEM

BACKGROUND

Technical Field

This disclosure relates to a photoelectric conversion apparatus having a light guide portion.

Description of the Related Art

There is a known photoelectric conversion apparatus configured to perform focus detection by using a plurality of photoelectric conversion portions on the basis of a phase difference method. A configuration in which a single pixel has a plurality of photoelectric conversion portions has many advantages in terms of improvement of a performance of an image pickup system such as speed increase owing to an improvement of a transfer efficiency or widening of a dynamic range as well as the focus detection.

Japanese Patent Laid-Open No. 2009-158800 discloses a mode in which a clearance surrounding effective light-receiving areas of two photo diodes is provided in an interlayer film. Japanese Patent Laid-Open No. 2009-158800 discloses a mode in which a clearance along a dividing line between photodiodes is provided in the interlayer film in addition to the clearance surrounding the effective light-receiving area of the two photodiodes.

In the mode of Japanese Patent Laid-Open No. 2009-158800, sensitivity is lowered and, in addition, light cannot be distributed to the two photodiodes with high degree of accuracy.

SUMMARY

This disclosure provides a photoelectric conversion apparatus including: a light-receiving element, including: a plurality of photoelectric conversion portions; a separating portion located between the plurality of photoelectric conversion portions; a light guide portion surrounded by an insulation film including at least one insulation layer and provided so as to extend over the plurality of photoelectric conversion portions, the light guide portion includes: a high refractive index part having a refractive index higher than a refractive index of the insulation layer; and a low refractive index part having a refractive index higher than the refractive index of the insulation layer and lower than the refractive index of the high refractive index part, and the high refractive index part is located on each of the plurality of photoelectric conversion portions and the low refractive index part is located on the separating portion.

Further features of the present invention will become apparent from the following description of exemplary embodiments with reference to the attached drawings.

BRIEF DESCRIPTION OF THE DRAWINGS

FIGS. 4A to 4J are schematic drawings illustrating examples of the light-receiving element.

FIGS. 5A to 5S are schematic drawings illustrating examples of the light-receiving element.

FIGS. 8A to 8J are schematic drawings illustrating examples of the light-receiving element.

DESCRIPTION OF THE EMBODIMENTS

Figure 1A:
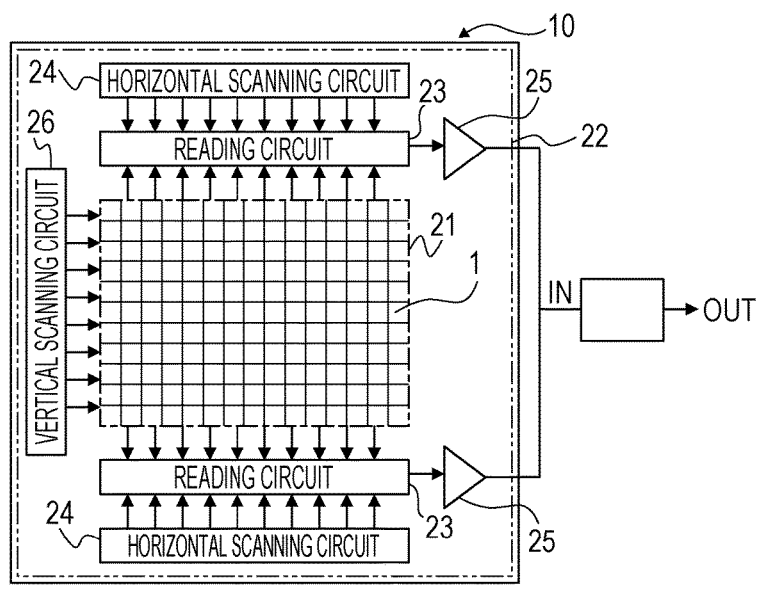
FIGS. 1A to 1C are schematic drawings illustrating examples of a photoelectric conversion apparatus.

Hereinafter, embodiments of this disclosure will be described with reference to the drawings. A mode described below is one embodiment only, and the disclosure is not limited thereto. In the description and drawings given below, configurations common in a plurality of drawings are denoted by common reference numerals. The common configuration will be described with reference to the plurality of drawings and the descriptions of the configurations denoted by the common numerals are omitted as needed. As regards items which will not be described below, an adequate technology may be applied thereto.

FIG. 1A is a drawing schematically illustrating a photoelectric conversion apparatus 10 as a pixel amplifying image sensor. The photoelectric conversion apparatus 10 illustrated in FIG. 1A includes a light-receiving area 21 as an area surrounded by an alternate chain line, and a peripheral area 22 which is an area between the alternate chain line and a double dashed chain line in the periphery of the light-receiving area 21. A plurality of light-receiving elements 1 are arranged in the light-receiving area 21 in a matrix pattern or in a row. The light-receiving area 21 may also be referred to as an image pickup area or a pixel area. An interval (pixel pitch) between center axes of the light-receiving elements adjacent to each other is typically not larger than 10 µm, and preferably not larger than 5.0 µm.

The peripheral area 22 is provided with a peripheral circuit including a vertical scanning circuit 26, two reading circuits 23, two horizontal scanning circuits 24, and two output amplifiers 25. The reading circuits 23 in the peripheral area 22 include, a row amplifier, a correlative duplicated sampling (CDS) circuit, and an adding circuit. The reading circuits 23 perform amplification, addition, and the like on a signal read out from a pixel of a row selected by the vertical scanning circuit 26 via a vertical signal line. The row amplifier, the CDS circuit, and the adding circuit are arranged in a pixel row, or in for each of a plurality of the pixel rows. The horizontal scanning circuits 24 generate a signal for reading out signals of the reading circuits 23 in sequence. The output amplifiers 25 amplify the signal of the row selected by the horizontal scanning circuits 24 and output the amplified signal. The configuration described above is one of configurations of the photoelectric conversion apparatus 10 only, and this disclosure is not limited thereto. The reading circuits 23, the horizontal scanning circuits 24, and the output amplifiers 25 constitute two systems of output route, and are arranged one each on the upper side and the lower side of the light-receiving area 21. However, the configuration is not limited thereto.

Figure 1B:
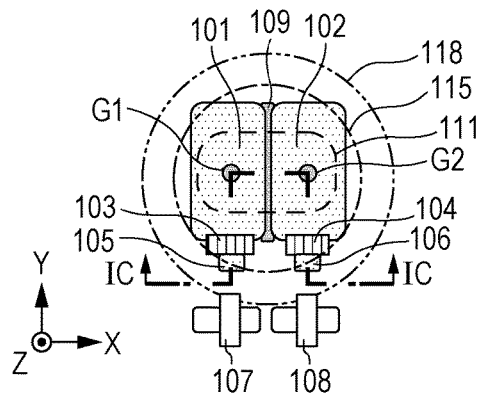
Figure 1C:
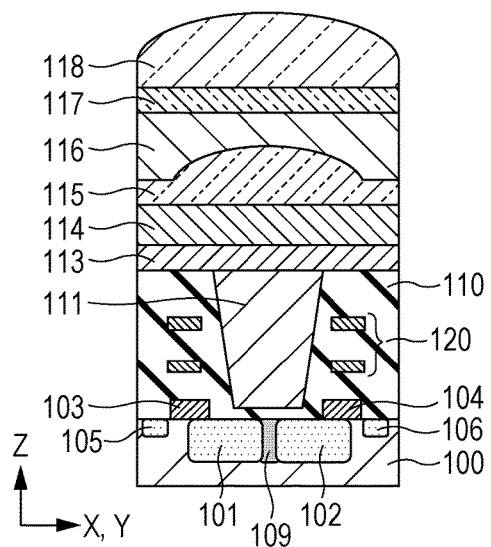

FIG. 1B is a schematic plan view illustrating an example of the light-receiving element 1, and FIG. 1C is a schematic cross-sectional view of the light-receiving element 1 taken along a line IC-IC in FIG. 1B. Each light-receiving element 1 includes a plurality of photoelectric conversion portions 101 and 102 provided inside a substrate 100 formed of a semiconductor. A separating portion 109 is provided between the plurality of the photoelectric conversion portions 101 and 102 to separate signal charges therebetween. The separating portion 109 may be an insulating member such as LOCOS or STI, which is configured to separate therebetween by insulation, or may be a conductive semiconductor area opposite to accumulating areas of the photoelectric conversion portions 101 and 102, which is configured to separate therebetween by joining thereto. In this example, separation by joining is employed. A separating performance of the separating portion 109 may be incomplete as long as which one of the plurality of photoelectric conversion portions 101 and 102 generates a larger amount of signal charge may be determined. Therefore, part of the signal charge generated by the photoelectric conversion portion 101 may be allowed to be detected by a detection portion as a signal charge generated by the photoelectric conversion portion 102.

The photoelectric conversion portions 101 and 102 of each of the plurality of light-receiving elements 1 are arrayed along a main surface of the substrate 100, which corresponds to an image pickup surface, in the common substrate 100. Part of the image pickup surface corresponds to light-receiving surfaces of the photoelectric conversion portions 101 and 102. A direction parallel to the image pickup surface or the light-receiving surface and two of the photoelectric conversion portions 101 and 102 are arranged via the separating portion 109 is defined as an X-direction. The direction in which the two photoelectric conversion portions 101 and 102 are arranged may be defined as a direction parallel to a straight line connecting a geometric gravity center G1 in plan view of the photoelectric conversion portion 101 and a geometric gravity center G2 in plan view of the photoelectric conversion portion 102. A direction in parallel to the image pickup surface and orthogonal to the X-direction is defined as a Y-direction. A direction vertical to the image pickup surface is defined as a Z-direction. The Z-direction is orthogonal to the X-direction and the Y-direction. Typically, in the light-receiving area 21, the X-direction may be one of a row direction (a direction in which a row extends) and a column direction (a direction in which a column extends) of the light-receiving elements 1 arrayed in a matrix pattern. Typically, in the light-receiving area 21, the Y-direction may be the other one of the row direction (the direction along a row) and the column direction (the direction along a column) of the light-receiving elements 1 arranged in a matrix pattern.

The photoelectric conversion portions 101 and 102 are photodiodes formed by introducing impurity in an interior of the substrate 100. The photoelectric conversion portions 101 and 102 as the photodiodes use many of the signal charges as carriers, and are formed by PN joint between a first conductive type semiconductor area (accumulating area) configured to accumulate the signal charge and a second conductive type semiconductor area. Another example of the photoelectric conversion portions 101 and 102 includes a photo gate, and a configuration formed as a semiconductor thin film having an MIS type structure or a PIN type structure formed on the substrate of an insulating material such as glass. The light-receiving area 21 of the photoelectric conversion apparatus 10 may include light-receiving elements having only one photoelectric conversion portion 101 in addition to the light-receiving elements 1.

The signal charge obtained by the photoelectric conversion portion 101 is transferred to a detection portion 105 via a transfer gate 103 having an MOS structure, and the signal charge obtained by the photoelectric conversion portion 102 is transferred to a detection portion 106 via a transfer gate 104 having e MOS structure. The detection portions 105 and 106 include, for example, a suspending and diffusing portion having a constant capacitance, and are capable of detecting a charge amount by converting the amount of the signal charge into a voltage. The detection portions 105 and 106 are connected to an amplifier transistor 107 and a reset transistor 108 respectively. Here, a configuration in which the detection portions 105 and 106 are provided for each of the photoelectric conversion portions 101 and 102, and the signal charges are transferred in parallel from the separately provided photoelectric conversion portions 101 and 102 is described. However, a common detection portion may be used in the case where the signal charges are transferred in serial by using the separately provided transfer gates 103 and 104 from the separately provided photoelectric conversion portions 101 and 102.

The plurality of light-receiving elements 1 are arranged in the light-receiving area 21 of the photoelectric conversion apparatus 10 illustrated in FIG. 1A, so that focus detection (AF) in the image pickup area is enabled by a phase difference detecting system. In addition, this configuration may be applied to an image pickup system (camera) which performs distance measurement by using the phase difference detecting method. Image pickup may also be performed by using a signal of at least one of the plurality of photoelectric conversion portions 101 and 102, which is output from the light-receiving element 1 as an image pickup signal. For example, the signals of the photoelectric conversion portions 101 and 102 are added to create the image pickup signal. In this manner, the photoelectric conversion apparatus 10 of this embodiment is capable of realizing, a so-called image surface phase difference AF by using the signals of the photoelectric conversion portions 101 and 102 both for the focus detection and the image pickup.

An insulation film 110 is provided on the substrate 100. The insulation film 110 may be transparent. The insulation film 110 may be a single layer film formed of a single material. Typically, however, the insulation film 110 is a multilayer film having a plurality of laminated layers formed of materials different from each other. A certain insulation layer of the insulation film 110 is formed of, for example, an oxidized silicon ($SiO_2$). A certain insulation layer may be formed of silicate glass such as BPSG (boron phosphorous silicate glass), PSG (borosilicate glass), and BSG (borosilicate glass). An insulation layer of the multilayer film which constitutes part of the insulation film 110 may be silicon nitride ($Si_3N_4$) or silicon carbide (SiC). Wiring 120 may be provided in an interior of the insulation film 110. The wiring 120 may be multiple layer wiring in which a plurality of wiring layers are connected via plugs. FIG. 1B illustrates an example in which the wiring 120 includes two layers. However, the wiring 120 may be multiple layer wiring having three or more layers. A conductive material such as copper, aluminum, tungsten, tantalum, titanium, and polysilicon may be used for the wiring 120.

The light-receiving element 1 includes at least one light guide portion 111, and the single light guide portion 111 is provided so as to extend over the plurality of photoelectric conversion portions 101 and 102. The light guide portion 111 has a function to block light incident on the light guide portion 111 in an interior of the light guide portion 111 and propagate the light to the photoelectric conversion portions 101 and 102.

The light guide portion 111 is surrounded by the insulation film 110. In other words, the insulation film 110 is located in the periphery of the light guide portion 111 within an XY plane. The light incident on the light guide portion 111 is reflected on an interface between the light guide portion 111 and the insulation film 110 and guided to the photoelectric conversion portions 101 and 102 by differentiating a refractive index of the light guide portion 111 from a refractive index of the insulation film 110. A total reflection may be caused by setting the refractive index of the light guide portion 111 to be higher than the refractive index of the insulation film 110, so that a reflection efficiency may be improved.

A material of the light guide portion 111 may be an organic material (resin) and may be an inorganic material. Examples of the resin include a siloxiane resin and a polyimide resin. Examples of suitable inorganic material include silicone nitride ($Si_XN_Y$), silicone oxynitride ($Si_XO_YN_Z$), and titanium oxide ($TiO_2$). The light guide portion 111 may be formed of a single material or may be formed of a plurality of materials.

Rough values of the refractive index of the materials exemplified as materials of the light guide portion 111 and the insulation film 110 will be listed below. The refractive index of silicon oxide falls within a range from 1.4 to 1.5, 1.6 to 1.9 for silicon oxynitride, 1.8 to 2.3 for silicon nitride, 2.5 to 2.7 for titanium oxide, and 1.4 to 1.6 for BSG, PSG, and BPSG. The values given above are examples only, and the refractive index can be set as needed since composition ratio or density and porosity of the material varies by changing a film forming method even though the material is the same. The refractive index of general resins falls within a range from 1.3 to 1.6, and that of a high refractive index resin falls within a range from 1.6 to 1.8. However, a resin containing a high refractive index inorganic material such as metal oxide may have an effective refractive index higher than that of the simple resin. Examples of the high refractive index inorganic material to be contained in the resin include titanium oxide, tantalum oxide, niobium oxide, tungsten oxide, zirconium oxide, zinc oxide, indium oxide, and hafnium oxide.

Other configurations of the light-receiving element 1 will be described. However, these configurations may be modified as needed. A high refractive index film 113 is provided on the light guide portion 111 and the insulation film 110. The high refractive index film 113 has a refractive index part higher than the refractive index of the insulation film 110. The high refractive index film 113 may be formed of the same material as the light guide portion 111. In such a case, a boundary between the high refractive index film 113 and the light guide portion 111 may be recognized to be located at the same level as the level of an upper surface of the insulation film 110.

An interlayer lens 115 is provided on the high refractive index film 113 with a low refractive index film 114 interposed therebetween. The low refractive index film 114 has a refractive index lower than that of at least one of the interlayer lens 115 and the high refractive index film 113 (or the light guide portion 111). The low refractive index film 114 has at least one of a function that adjusts the distance between the interlayer lens 115 and the light guide portion 111, a function of planarization, and a light-focusing function on the basis of the refraction of light. A wavelength selecting portion 117 is provided on the interlayer lens 115 via a planarizing film 116. The wavelength selecting portion 117 is a color filter or a dichroic mirror, and has wavelength transmitting properties different from one light-receiving element 1 to another in the light-receiving area 21 in accordance with Bayer layout or the like. A light condensing portion 118 formed as a micro lens is provided on the wavelength selecting portion 117. The single light guide portion 111, the single interlayer lens 115, the single wavelength selecting portion 117, and the single light condensing portion 118 correspond to the plurality of photoelectric conversion portions 101 and 102. In the following description, "the refractive index of the insulation film 110" is described as the refractive index of a certain insulation layer of the insulation film 110. "The refractive index of the light guide portion 111" is described as the refractive index of the material that forms a certain part of the light guide portion 111. The refractive index of the certain part of the light guide portion 111 is higher than the refractive index of the certain insulation layer of the insulation film 110. However, the insulation film 110 may include the insulation layer having a refractive index higher than the refractive index of the certain part of the light guide portion 111. It is preferable that a major part of the insulation film 110 has a refractive index higher than the refractive index of a major part of the light guide portion 111. The insulation layer having a refractive index higher than that of the certain part of the light guide portion 111 is preferably thinner than the insulation layer having a refractive index lower than the refractive index of the certain part of the light guide portion 111.

The simple term "refractive index" in this disclosure means an absolute refractive index. The refractive index varies with the wavelength, but is a refractive index with respect to the wavelength of the light which may generate the signal charge at least in the photoelectric conversion portion 101. It is preferable to employ a wavelength of light which is subjected to photoelectric conversion most in the photoelectric conversion portion as a reference. In the case where the photoelectric conversion apparatus 10 includes a wavelength selecting portion such as a color filter, a wavelength of light transmitting through the wavelength selecting portion, specifically, a main transmitting wavelength is preferably used. Specifically, it is preferable to use the light-receiving element 1 having a green color filter having a peak in the vicinity of 550 nm as a reference. Selectivity of the wavelength selecting portion may be incomplete. In other words, transmittance of wavelengths which are selected by the wavelength selecting portion may be lower than 100%, and the transmittances of the wavelengths which are not selected by the wavelength selecting portion may not have to be 0%.

Figure 2A:
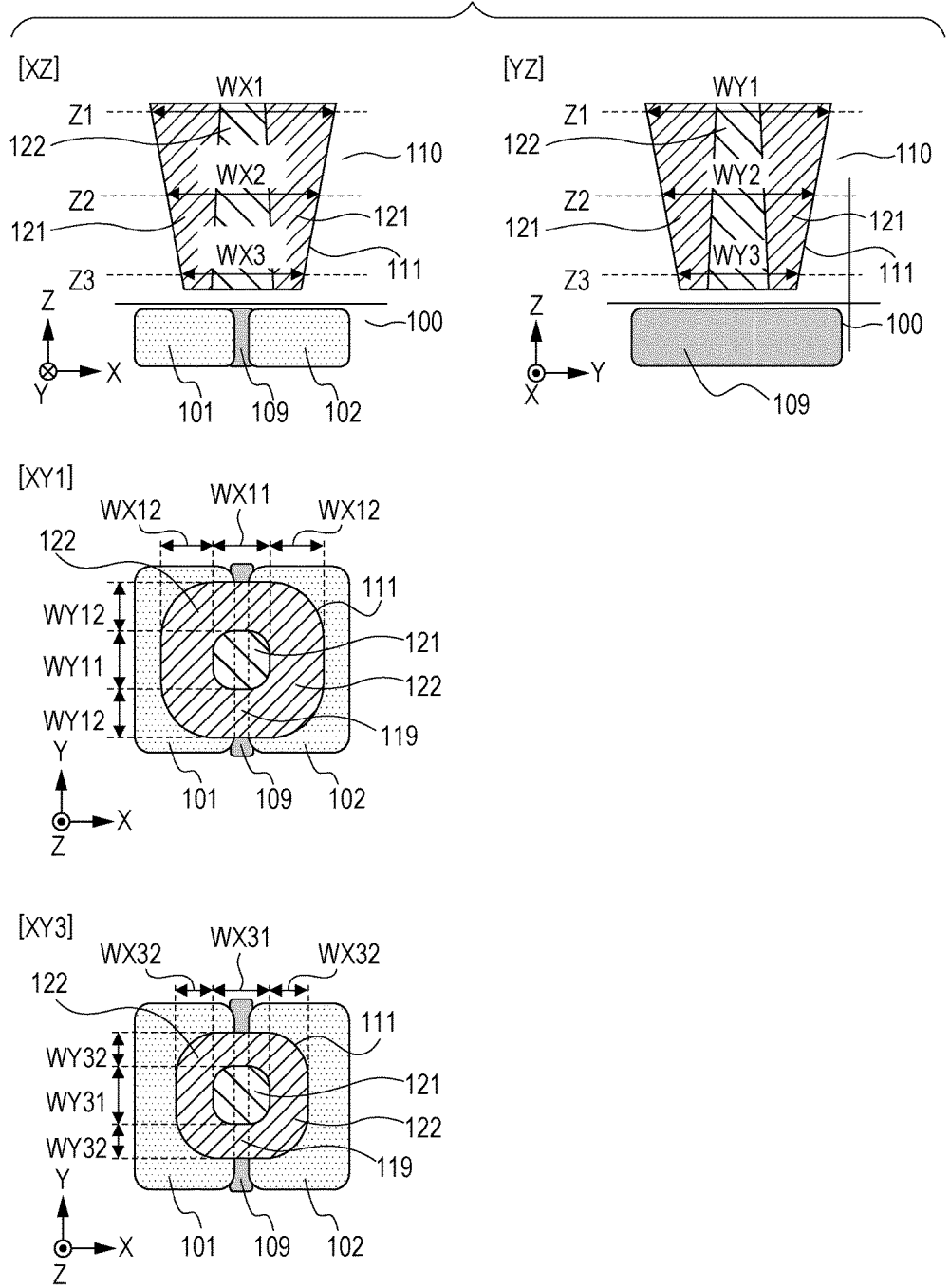
FIGS. 2A and 2B are schematic drawings illustrating examples of a light-receiving element.

With reference to FIG. 2A, a shape of the light guide portion 111 will be described in detail. XZ in FIG. 2A is a cross-sectional view of the light-receiving element 1 taken along an XZ plane, and YZ is a cross-sectional view of the light-receiving element 1 taken along an YZ plane. XY1 is a cross-sectional view of the light-receiving element 1 taken along the XY plane at a position (height) Z1 in the Z-direction, and XY3 is a cross-sectional view of the light-receiving element 1 taken along the XY plane at a position (height) Z3 in the Z-direction. However, the cross-sectional views XY1 and XY3 taken along the XY plane are illustrated in a manner in which the positions of the photoelectric conversion portions 101 and 102 and the separating portion 109 overlap with the light guide portion 111 for the sake of convenience. The X-direction corresponds to a direction in which the plurality of photoelectric conversion portions 101 and 102 are arranged as described above. A position Z2 is a position at a half the length of the light guide portion 111 in the Z-direction and, for example, the position Z2 is a position between a first wiring layer and a second wiring layer. The position Z1 is farther from the substrate 100 than the position Z2, and the position Z3 is closer to the substrate 100 than the position Z2.

The light guide portion 111 of this embodiment includes a refractive index distribution in the interior thereof. In other words, the light guide portion 111 includes a low refractive index part 121 and a high refractive index part 122 as a plurality of portions having refractive indexes different from each other. The refractive index of the low refractive index part 121 is lower than the refractive index of the high refractive index part 122. In order to improve sensitivity with respect to light guided by the light guide portion 111, both of the refractive indexes of the low refractive index part 121 and the high refractive index part 122 are set to be higher than the refractive index of the insulation film 110. In FIG. 2A, the light guide portion 111 includes the low refractive index part 121 and the high refractive index parts 122 arranged in the X-direction and the Y-direction. In the X-direction, the high refractive index parts 122 are located on the −X side and the +X side of the low refractive index part 121. In other words, in the X-direction, the low refractive index part 121 is interposed between the high refractive index parts 122. At least part of the low refractive index part 121 is located above the separating portion 109, and at least parts of the high refractive index parts 122 are arranged on the photoelectric conversion portions 101 and 102 respectively. A plane (XY plane) parallel to the substrate 100 for evaluating the refractive index distribution of the light guide portion 111 may be a plane at any position (height) in the Z-direction as long as the plane penetrates through the light guide portion 111. Z1 is the position in three XY planes traversing the light guide portion 111 farther from the substrate 100 than the position Z2 on the light incident side, and Z3 is the position on the XY plane closer to the substrate 100 than the position Z2 on the light outgoing side.

Materials of the low refractive index part 121 and the high refractive index part 122 may be different materials, or may be the same material. The materials of the low refractive index part 121 and the high refractive index part 122 may be an organic material (resin) and may be an inorganic material. Examples of the resin include a siloxiane resin and polyimide. Examples of suitable inorganic material include silicone nitride ($Si_3N_4$), silicone oxynitride ($Si_xO_yN_Z$), and titanium oxide ($TiO_2$). For example, the low refractive index part 121 may be formed of the resin, and the high refractive index part 122 may be formed of the silicon nitride. Both of the low refractive index part 121 and the high refractive index part 122 may be formed of the silicon nitride. In this case, for example, the density of the silicon nitride of the high refractive index part 122 is set to be higher than the density of the silicon nitride of the low refractive index part 121, so that a desired refractive index distribution is achieved. Alternatively, the composition ratio of silicon with respect to nitride (Si/N) of the high refractive index part 122 is set to be larger than the composition ratio of silicon with respect to the nitride (Si/N) of the low refractive index part 121, so that the desired refractive index distribution is achieved.

The expression "the same material" means materials having the same composition in terms of stoichiometric point of view (stoichiometric composition). Therefore, the materials having stoichiometric compositions which are not match with each other, and materials different in crystalline properties, material density, concentration of added substances (should be smaller in quantity than the main material), and impurities (1 wt % or less) and the concentration thereof may be recognized to be the "same material". For example, the stoichiometric composition ratio between silicon and nitride in silicon nitride is Si:N=3:4, but the materials different in actual ratio between Si and N are recognized to be the same material. It is because the silicon nitride as the same material as described above has the same Si—N bonding as the silicon nitride having compositions matching with the stoichiometric composition.

When observing the light guide portion 111 having the refractive index distribution with images such as SEM or TEM, a boundary between the low refractive index part 121 and the high refractive index part 122 may be and may not be observed clearly. For example, in the case where the refractive index varies gently from a center axis of the light guide portion 111 toward the insulation film 110, the boundary between the low refractive index part 121 and the high refractive index part 122 may not be observed clearly. In such a case, the boundary between the low refractive index part 121 and the high refractive index part 122 may be determined in the following manner. An intermediate value (maximum value+minimum value/2) between a maximum value and a minimum value of the refractive index in the light guide portion 111 is obtained. In the refractive index distribution within the light guide portion 111, a line connecting the intermediate values may be determined as the boundary between the low refractive index part 121 and the high refractive index part 122. The intermediate value between the maximum value and the minimum value of the refractive index in the light guide portion 111 may be recognized as the refractive index of the light guide portion 111 as an average refractive index of the light guide portion 111. In the case where the refractive index of the high refractive index part 122 is higher than the refractive index of the low refractive index part 121, the low refractive index part 121 includes a portion having a minimum refractive index and the high refractive index part 122 includes a portion having a maximum refractive index.

Practically, the refractive indexes of the low refractive index part 121 and the high refractive index part 122 are preferably at least 1.6. A difference between the maximum value and the minimum value of the refractive index in the above-described refractive index distribution is preferably at least 0.025, and more preferably at least 0.050. A ratio of the refractive indexes between the low refractive index part 121 and the high refractive index part 122 (maximum value/minimum value) is preferably at least 1.025 times. Typically, the ratio between the maximum value and the minimum value of the refractive index (maximum value/minimum value) is practically not larger than 1.25 times. As a matter of course, the low refractive index part 121 includes the portion having the minimum refractive index and the high refractive index part 122 includes the portion having the maximum refractive index. Preferably, a difference between the refractive index of the insulation film 110 and the refractive index of the low refractive index part 121 is larger than a difference between the refractive index of the low refractive index part 121 and the refractive index of the high refractive index part 122 for improving a distribution accuracy of light while achieving a light-guiding function as the light guide portion 111.

Figure 2B:
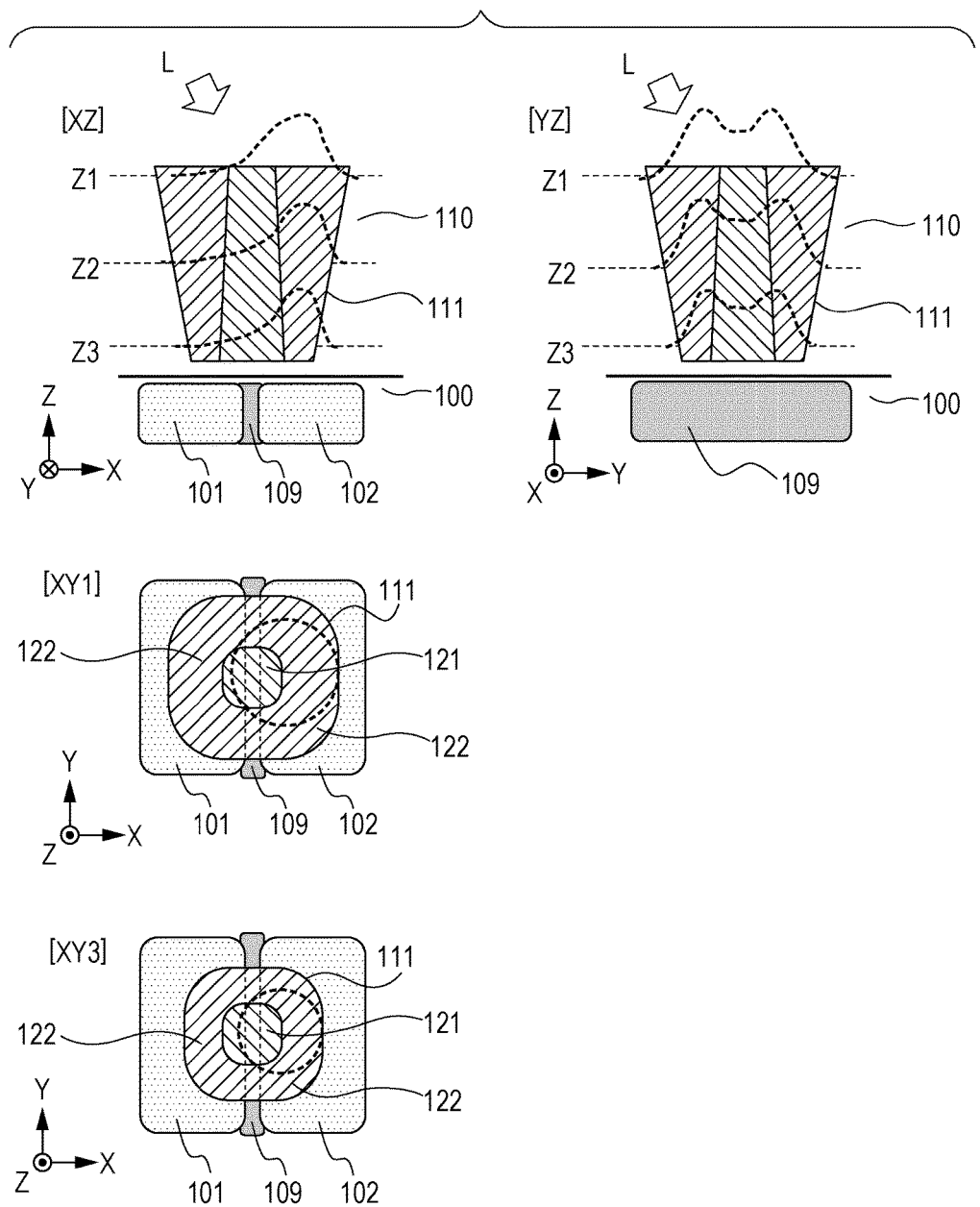

FIG. 2B illustrates a state in which light L incident on the light guide portion 111 from an oblique angle (arrow) is propagated in the light guide portion 111 in a mode illustrated in FIG. 2A. In XZ and YZ in FIG. 2B, electric field intensity distributions at the positions Z1, Z2, and Z3 are illustrated by dot lines. In XY1 and XY3 in FIG. 2B, contour lines of electric field intensity at the positions Z1 and Z3 are illustrated. In an example of a light waveguide structure, which is a model of the electric field intensity distribution in FIG. 2B, the refractive index of the low refractive index part 121 of the light guide portion 111 is set to 1.82, the refractive index of the high refractive index part 122 thereof is set to 1.90, and the refractive index of the insulation film 110 is set to 1.46. The maximum width of the light guide portion 111 in the X-direction and the Y-direction at Z1 is set to 1.6 um, and the maximum width of the light guide portion 111 in the X-direction and the Y-direction at Z3 is set to 1.25 um. An interval between a width TH1 of the high refractive index part 122 at Z1 (the boundary between the low refractive index part 121 and the high refractive index part 122) and the insulation film 110 is 0.3 um. However, the conditions are not limited thereto, and the same electric field intensity distribution is achieved by satisfying the above-described refractive index distribution.

In wave-optics point of view, the electric field intensity distribution of light incident on the light guide portion 111 propagates while waving. Here, portions having a high electric field intensity indicates that a large amount of light is present stochastically. At this time, the shape of light propagating in the light guide portion 111 (the shape of the electric field intensity distribution) depends on the shape and the refractive index of the light guide portion 111. It can be considered that light tends to concentrate in an area having high refractive indexes. The refractive indexes of the low refractive index part 121 and the high refractive index part 122 of the light guide portion 111 are higher than the refractive index of the insulation film 110, so that the light can be propagated to the substrate 100 while being blocked in the light guide portion 111. The refractive index distribution in the interior of the light guide portion 111 of this embodiment has a configuration in which the refractive index in the vicinity of the high refractive index part 122 in the vicinity of a side wall on the −X side or the +X side is larger than that of a portion in the vicinity of the center with respect to the low refractive index part 121 in the vicinity of the center of the light guide portion 111 in the X-direction. Therefore, the light tends to propagate in the vicinity of the side wall of the light guide portion 111.

At this time, as illustrated in XZ in FIG. 2B, when the incident light L having vectors of +X-direction and −Z-direction enters, light is deflected to the +X side in the vicinity of the position Z1 in the Z-direction, which is near an inlet of the light guide portion 111. The light deflected toward the X side at the position Z1 in the vicinity of the inlet of the light guide portion 111 propagates as light having a shape deflected in the X-direction to the position Z3 in the vicinity of an outlet of the light guide portion 111. In addition, although the high refractive index part 122 is located above the two photoelectric conversion portions 101 and 102, since the low refractive index part 121 is located therebetween, the light deflected to the +X side is suppressed from spreading toward the −X side, and hence tends to enter the photoelectric conversion portion 102 located on the +X side. In the same manner, in the case of incident light (not illustrated) from an angle having a vector in the −X-direction and −Z-direction, majority of the incident light tends to enter the photoelectric conversion portion 101 located on the −X side. In this manner, light is distributed accurately to the photoelectric conversion portions 101 and 102 arranged in the X-direction.

Figure 3A:
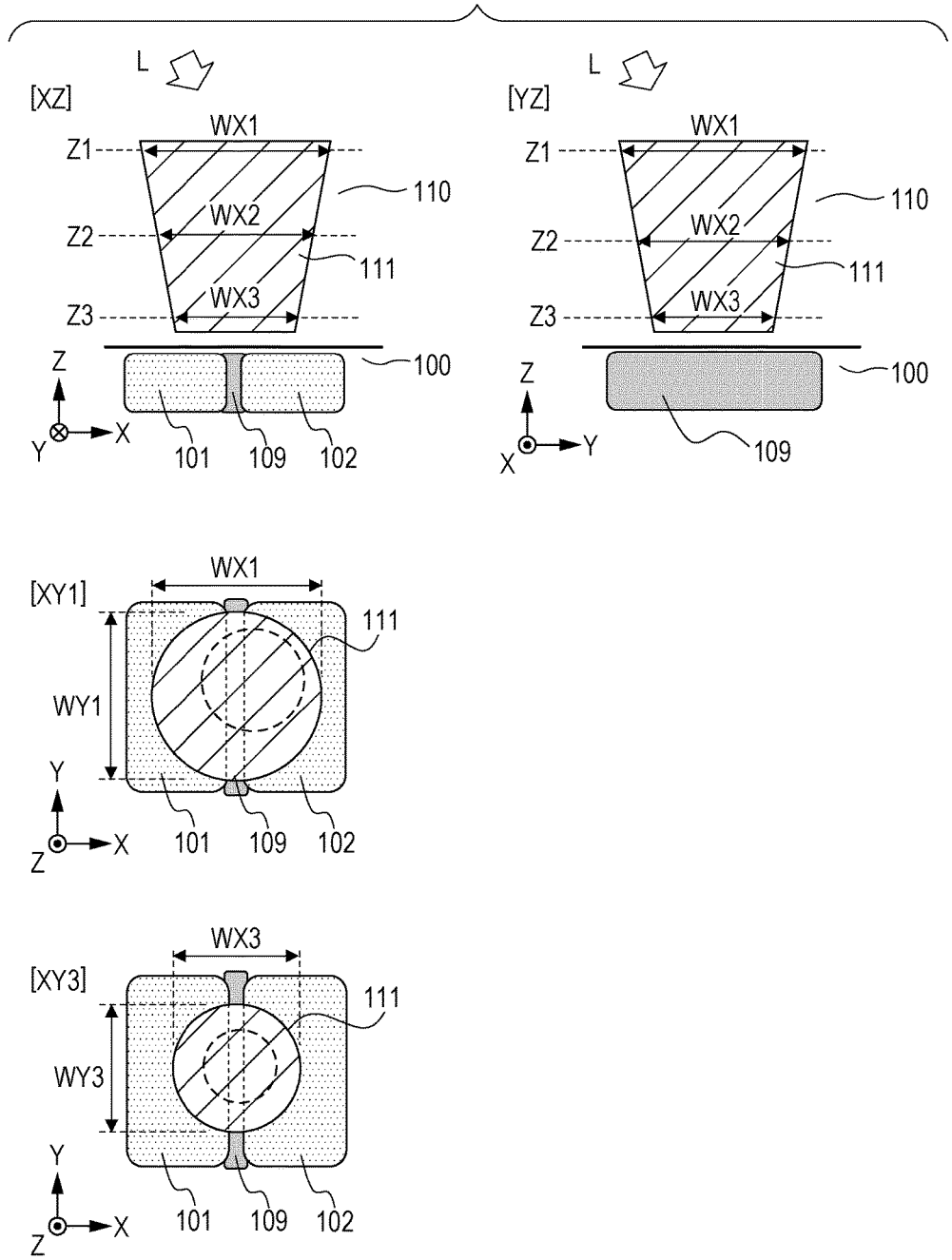
FIGS. 3A to 3C are schematic drawings illustrating examples of the light-receiving element.

For comparison, the case where the refractive index of the light guide portion 111 is uniform is illustrated in FIG. 3A. In this case, light propagating in the light guide portion 111 tends to spread toward the center of the light guide portion 111 as illustrated in XY3 in FIG. 3A, and deflection in the X-direction is smaller in the X-direction in comparison with the case where the light guide portion 111 has the refractive index distribution. Therefore, the amount of light incident on a portion in the vicinity of the separating portion 109 of the photoelectric conversion portions 101 and 102 arranged in the X-direction is increased, so that the light L cannot be distributed accurately. For example, the light L incident from an angle having a vector of +X component and −Z component enters the photoelectric conversion portion 101 and the photoelectric conversion portion 102 substantially equally. Therefore, the light L cannot be distributed adequately to the photoelectric conversion portion 101 and the photoelectric conversion portion 102 in this manner.

Figure 3B:
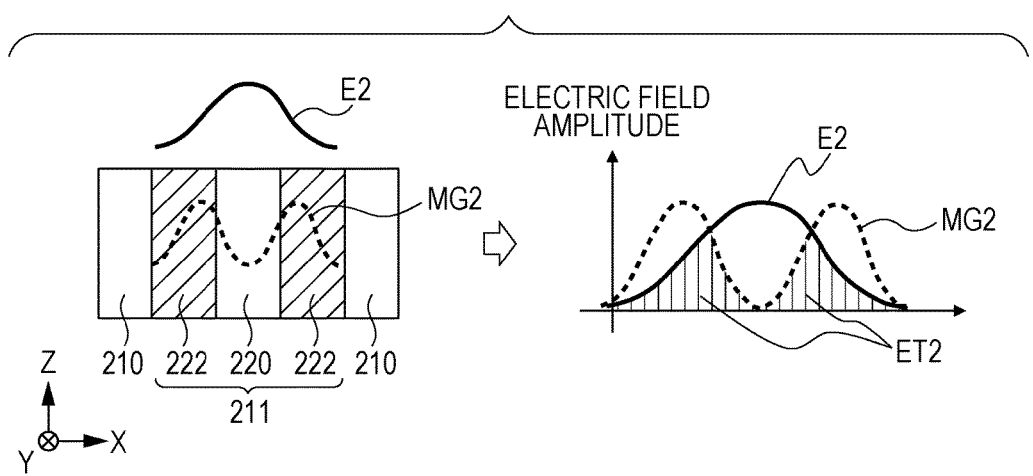

For further comparison, the case where a low refractive index part 220 having a refractive index lower than a refractive index of an insulation film 210 is formed in an interior of a light guide portion 211 will be described with reference to FIG. 3B. The low refractive index part 220 is formed, for example, of the same material as the insulation film 210, aerogel, gas, or a vacuum space. In the case where the low refractive index part 220 is formed to reflect light, it is possible to distribute incident light to the two photoelectric conversion portions. However, there arises a problem of lowering of sensitivity. Since the low refractive index part 220 has a certain realistic width, majority of incident light incident on the light guide portion 211 is reflected by an upper portion of the low refractive index part 220, and sensitivity is lowered. In the case where the low refractive index part 220 is provided, a cause of reflection of the incident light at an entry (upper portion) in a wave optics manner will be described. In FIG. 3B, for example, it is assumed that the refractive index of the insulation film 210 is 1.5, a refractive index of a high refractive index part 222 is 1.9, and the refractive index of the low refractive index part 220 is 1.0. In FIG. 3B, the incident light indicated by an electric field amplitude E1 is collected to a portion in the vicinity of the center of the entry of the light guide portion 211 provided with the low refractive index part 220. Efficiency that the incident light is coupled to light propagating in the light guide portion 211 is determined by an overlapping portion ET2 of the shape of a wave guide mode MG2 of light propagating the light guide portion 211 and the shape of the electric field amplitude of the incident light (electric field amplitude E1) (a drawing on the right in FIG. 3B). The light propagates concentrically to a portion having a high refractive index. In the case of the light guide portion 211 provided with the low refractive index part 220, likelihood that the light exists at a portion where the low refractive index part 220 is provided is lowered, and a wave guide mode having a low intensity at the portion in the vicinity of the center of the light guide portion 211 as illustrated in a drawing on the right in FIG. 3B. At this time, an overlapping portion ET between the incident light and the electric field amplitude E1 is reduced, so that coupling efficiency is lowered. Light which is not coupled at the light guide portion 211 is reflected and lost.

Figure 3C:
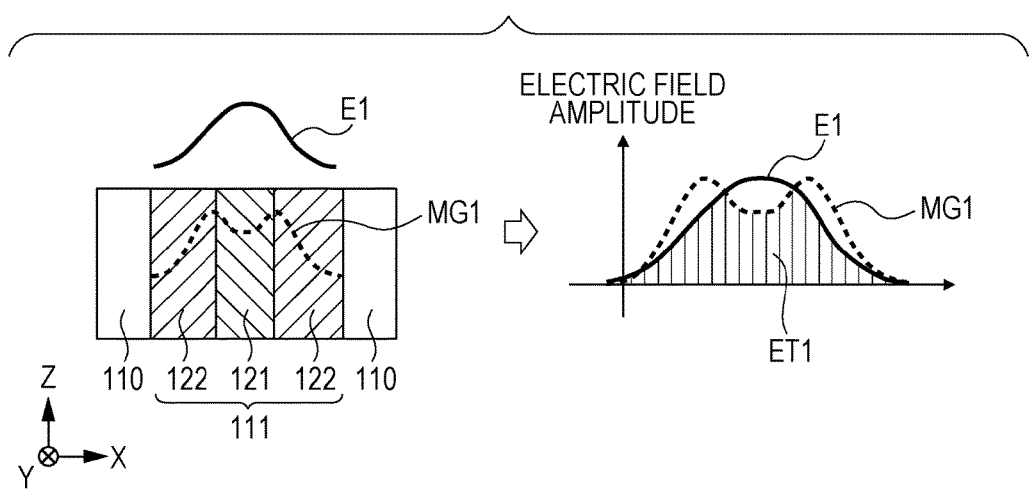

In contrast, the case of the light guide portion 111 of this embodiment is illustrated in FIG. 3C. In FIG. 3C, for example, it is assumed that the refractive index of the insulation film 110 is 1.5, the refractive index of the low refractive index part 121 is 1.8, and the refractive index of the high refractive index part 122 is 1.9. A wave guide mode MG1 in FIG. 3C is a wave guide mode which light propagating in the light guide portion 111 may take. The wave guide mode MG1 of the light guide portion 111 is as illustrated in a drawing on the right in FIG. 3C. At this time, an overlapping portion ET1 of the incident light in the wave guide mode is larger than the overlapping portion ET2 in FIG. 3B. Consequently, the light guide portion 111 of this embodiment is more capable of suppressing lowering of sensitivity due to the reflection in comparison with the light guide portion 211 provided with the super low refractive index part 220. Practically, the ratio between the maximum value and the minimum value of the refractive indexes of the low refractive index part 121 and the high refractive index part 122 (maximum value/minimum value) is not larger than 1.25 times. As a matter of course, the low refractive index part 121 includes a portion having the minimum refractive index and the high refractive index part 122 includes a portion having the maximum refractive index. At this time, the light can be distributed efficiently to the photoelectric conversion portion 101 while improving the sensitivity.

The mode illustrated in FIGS. 2A and 2B will further be described. The cross sections of the light guide portion 111 of this example on the XZ plane and the YZ plane has a tapered shape, and the size of the cross section in XY plane has a shape gradually increasing from the substrate 100 toward the direction (+Z-direction) on the light incident side. With a configuration in which an inlet of the light guide portion 111 which allows entry of the incident light, a large amount of the incident light can be taken. A ratio of loss of light in a transfer transistor formed in the vicinity of the surface of the substrate 100 can be reduced by reducing the size of the cross section of the light guide portion 111 on the substrate 100 side. Consequently, light may be distributed efficiently to the plurality of the photoelectric conversion portions 101 and 102 while further improving the sensitivity. For example, a diameter of the light guide portion 111 at Z1 is 0.3 um to 10 um, and the diameter of the light guide portion 111 at Z3 is 0.25 to 9.5 um.

A diameter WZ of the light guide portion 111 is preferably set as follows. In other words, $WZ \geq \lambda/2n_{ea}$ is preferably satisfied, where $n_a$ is an average refractive index of the light guide portion 111 at a wavelength $\lambda$, n0 is the refractive index of the insulation film 110, and $n_{ea}$ is an effective refractive index difference. It is because the number of modes which can be present in the light guide portion 111 may be increased by satisfying the condition described above. The effective refractive index difference $n_{ea}$ is expressed by Expression 1.

$$nea=\sqrt{n_a^2-n_0^2}$$ (Expression 1)

In this manner, by satisfying the condition $WZ \lambda/2\sqrt{(n_a^2-n_0^2)}$, the number of modes which can be present in the light guide portion 111 may be increased. A portion of the light guide portion 111 which satisfies the width WZ as described above is preferably present at the position Z1 in the vicinity of the inlet of the light guide portion 111. At the position Z3 in the vicinity of an outlet of the light guide portion 111, the light guide portion 111 does not have to have a width satisfying such a relationship. The relationship of the above-described width may be established only for the width in the Y-direction, but preferably is established at least for the width in the X-direction.

At least one of the width of the low refractive index part 121 and the width of the high refractive index part 122 may be different depending on the position in the Z-direction. As illustrated in XY1 in FIG. 2A, the width of the low refractive index part 121 in the X-direction is WX11 and the width of the high refractive index part 122 is WX12 at the position Z1. In contrast, as illustrated in XY3 in FIG. 7, the width of the low refractive index part 121 in the X-direction is WX31 and the width of the high refractive index part 122 is WX32 at the position Z3. Relationships of WX11<WX31 and WX12>WX32 are satisfied. As illustrated in XY1 in FIG. 7, the width of the low refractive index part 121 in the Y-direction is WY11 and the width of the high refractive index part 122 is WY12 at the position Z1. In contrast, as illustrated in XY3 in FIG. 7, the width of the low refractive index part 121 in the Y-direction is WY31 and the width of the high refractive index part 122 is WY32 at the position Z3. Relationships of WY11<WY31 and WY12>WY32 are satisfied. In an example in FIG. 7, the width of the low refractive index part 121 is increased continuously as it approaches the photoelectric conversion portions 101 and 102 both in the X-direction and the Y-direction. The width of the high refractive index part 122 is decreased continuously as it approaches the photoelectric conversion portions 101 and 102. However, the width of the low refractive index part 121 and the high refractive index part 122 may be changed stepwise.

A width TH of the high refractive index part 122 of the light guide portion 111 (the boundary between the low refractive index part 121 and the high refractive index part 122 and the insulation film 110) is preferably set as follows. In other words, preferably, $TH \geq \lambda/4n_{eh}$ and, more preferably, $TH \geq \lambda/2n_{eh}$ is preferably satisfied, where $n_2$ is a refractive index of the high refractive index part of the light guide portion 111 at a wavelength $\lambda$, $n_0$ is the refractive index of the insulation film 110, and $n_{eh}$ is an effective refractive index difference. The effective refractive index difference $n_e$ is expressed by Expression 2.

$$neh=\sqrt{n_2^2-n_0^2}$$ (Expression 2)

In this manner, by satisfying the condition TH $\lambda/4\sqrt{(n_2^2-n_0^2)}$, the number of modes which can exist in the high refractive index part 122 may be increased. A portion of the high refractive index part 122 which satisfies the width TH as described above is preferably present at the position Z1 in the vicinity of the inlet of the light guide portion 111. At the position Z3 in the vicinity of the outlet of the light guide portion 111, the high refractive index part 122 does not have to have the width satisfying such a relationship. The above-described width is preferably the width in the X-direction.

The shape of the refractive index distribution in the low refractive index part 121 and the high refractive index parts 122 in the XZ plane is not limited to the shape illustrated in FIG. 2A. In the X-direction, if there is an area in which the high refractive index part 122, the low refractive index part 121, and the high refractive index part 122 arranged in this order, light is deflected in the X-direction due to the reason described above, so that the light may be distributed effectively to the two photoelectric conversion portions 101 and 102. Although the refractive index distribution described above is established at a certain position in the Z-direction, the refractive index may be uniform in the XY plane at another position in the Z-direction. When the incident light L having a vector of the +X-direction and the −Z-direction as illustrated in FIG. 2A enters, the light is deflected in the X-direction in the vicinity of the inlet of the light guide portion 111. The light deflected in the X-direction in the vicinity of the inlet of the light guide portion 111 propagates to the substrate 100 in the shape deflected in the X-direction. In wave-optics point of view, the light propagates while being coupled more with odd modes such as primary or third modes in addition to even modes such as zero-order or secondary modes in the high refractive index part 122. Therefore, the light is deflected in the X-direction. The odd mode is a wave guide mode parallel to the Z-direction in the XZ plane, and having a shape of the electric field amplitude of an odd function with respect to an axis passing through the center of the light guide portion 111, and the even mode is the wave guide mode having the shape of the electric field amplitude in the form of an even function. In the odd mode, the light propagates in the light guide portion 111 while keeping the state of the odd mode. Therefore, even though the refractive index of the light guide portion 111 in the vicinity of the outlet is uniform, the light is deflected in the X-direction. Even though the refractive index is uniform in the vicinity of the inlet of the light guide portion 111, since the area in which the high refractive index part 122, the low refractive index part 121, and the high refractive index part 122 are arranged in this order in the X-direction exists in a range from a midpoint in the Z-direction to the substrate 100, the light deflects in the Z-direction. Consequently, the light may be distributed efficiently to the photoelectric conversion portion 101 while improving the sensitivity.

With reference to FIGS. 4A to 4J, examples of the refractive index distribution of the light guide portion 111 will be described. In a mode illustrated in FIG. 4A, the high refractive index part 122 is located between the low refractive index part 121 and the photoelectric conversion portions 101 and 102 in the lower portion in the Z-direction, and a lower surface of the light guide portion 111 (light outgoing surface) is entirely formed of the high refractive index part 122. In a mode illustrated in FIG. 4B, the high refractive index part 122 does not extend to a lower end of the light guide portion 111, and the lower portion of the light guide portion 111 is entirely formed of the high refractive index part 122. In a mode illustrated in FIG. 4C, the width of the low refractive index part 121 is decreased as it approaches the photoelectric conversion portions 101 and 102. The width of the high refractive index part 122 is constant. In a mode illustrated in FIG. 4D, the width of the high refractive index part 122 increases as it approaches the photoelectric conversion portions 101 and 102. In a mode illustrated in FIG. 4E, the low refractive index part 121 is located between the high refractive index part 122 and the photoelectric conversion portions 101 and 102 in an upper portion in the Z-direction, and an upper surface of the light guide portion 111 (light incident surface) is entirely formed of the high refractive index part 122 in the upper portion in the Z-direction. In a mode illustrated in FIG. 4F, an upper surface of the light guide portion 111 (the light incident surface) is entirely formed of the high refractive index part 122. In a mode illustrated in FIG. 4G, the lower surface (the light outgoing surface) of the light guide portion 111 is entirely formed of the low refractive index part 121. In a mode illustrated in FIG. 4G, the width of the low refractive index part 121 increases as it approaches the photoelectric conversion portions 101 and 102, and the width of the high refractive index part 122 decreases as it approaches the photoelectric conversion portions 101 and 102. In a mode illustrated in FIG. 4H, the lower surface (the light incident surface) of the light guide portion 111 is entirely formed of the low refractive index part 121. In a mode illustrated in FIG. 4I, the lower portion of the light guide portion 111 is entirely formed of the high refractive index part 122. In a mode illustrated in FIG. 4J, the lower portion and the upper portion of the light guide portion 111 are entirely formed of the high refractive index part 122.

In FIGS. 4A to 4J, the mode in which the width of the light guide portion 111 decreases as it approaches the photoelectric conversion portions 101 and 102 has been described. However, the width of the light guide portion 111 may be constant irrespective of the position in the Z-direction or may increase as it approaches the photoelectric conversion portions 101 and 102. In the case where the width of the light guide portion 111 increase as it approaches the photoelectric conversion portions 101 and 102, the widths of both of the low refractive index part 121 and the high refractive index part 122 may increases as it approaches the photoelectric conversion portions 101 and 102.

FIGS. 5A to 5O illustrate examples of a cross-sectional shape of the light guide portion 111 at a given position Z in the XY plane. In the XY plane at a certain position in the Z-direction, the light guide portion 111 may have a non-rotational symmetrical shape. In the XY plane at an entire position in the Z-direction, the light guide portion 111 may have a non-rotational symmetrical shape. As illustrated in FIG. 5A, the cross-sectional shape of the light guide portion 111 may be an oval shape. As illustrated in FIG. 5B, a longitudinal direction of the cross-sectional shape of the light guide portion 111 may be inclined with respect to a direction (X-direction) in which the plurality of photoelectric conversion portions are arranged. As illustrated in FIG. 5C, a portion of the light guide portion 111 located above the photoelectric conversion portions 101 and 102, not above the separating portion 109, may have a maximum width in the Y-direction larger than the maximum width in the X-direction. As illustrated in FIG. 5D, the light guide portion 111 may have a shape including a plurality of light guide portions combined to each other. As illustrated in FIG. 5E, the cross-sectional shape of the light guide portion 111 may be a polygonal shape. For example, the light guide portion 111 may have a shape illustrated in FIG. 5A in the XY plane at a certain position (for example, Z1) on the light incident side and have a shape illustrated in FIG. 5D in the XY plane at another position (for example, Z3) on the substrate 100 side.

As illustrated in FIG. 5F to 5J, the light guide portion 111 may have a cross-sectional shape in which the maximum width in the Y-direction of the XY plane at a certain position in the Z-direction is not smaller than the maximum width thereof in the X-direction. Specifically, as illustrated in FIG. 5F, the cross-sectional shape of the light guide portion 111 may be a circular shape. As illustrated in FIG. 5G, the cross-sectional shape of the light guide portion 111 may have a rectangular shape with rounded corners having the maximum width in the Y-direction larger than that in the X-direction. As illustrated in FIG. 5H, the cross-sectional shape of the light guide portion 111 may be a cross shape. As illustrated in FIG. 5I, a plurality of light guide portions 1121 and 1122 each of which does not extend over the plurality of photoelectric conversion portions 101 and 102. The light guide portion 111 may have a shape as illustrated in FIG. 5D in the cross section at a certain position in the Z-direction (for example, Z1), and have a shape as illustrated in FIG. 5I in the cross section at another position (for example Z3). As illustrated in FIG. 5J, the cross-sectional shape of the light guide portion 111 may be a square shape. For example, the light guide portion 111 may have a shape as illustrated in FIG. 5E in the cross section at a certain position in the Z-direction, and have a shape as illustrated in FIG. 5F in the cross section at another position. In such a case, the maximum width in the Y-direction may be constant irrespective of the height in the Z-direction as illustrated in FIGS. 5E and 5F.

As illustrated in FIG. 5K, a single light guide portion 111 may be provided so as to extend over three or more of photoelectric conversion portions 101, 1021, and 1022. As illustrated in FIG. 5I, the plurality of light guide portions 1111 and 1112 arranged so as to extend over the plurality of photoelectric conversion portions 101 and 102 may be provided in the single light receiving element 1. As illustrated in FIG. 5M, the single light guide portion 111 may be provided so as to extend over four or more of the photoelectric conversion portions 1011, 1021, 1012, and 1022. In this case, six different combinations are conceivable for the two photoelectric conversion portions selected from the four photoelectric conversion portions. However, the relationship that the maximum width of the light guide portion 111 in the direction or arrangement of photoelectric conversion portions is larger than the maximum width of the light guide portion 111 in the direction orthogonal to the direction of arrangement does not have to be satisfied in all of the six different combinations.

In the case where the single light receiving element 1 includes four photoelectric conversion portions, when putting great value on the distribution to the photoelectric conversion portions arranged in the row direction, the maximum width of the cross section of the light guide portion 111 in a row direction is set to be larger than the maximum width thereof in a column direction. When putting great value on the distribution to the photoelectric conversion portions arranged in the column direction, the maximum width of the cross section of the light guide portion 111 in the column direction is set to be larger than the maximum width thereof in the row direction.

As illustrated in FIG. 5N, a mode in which the single light receiving element 1 includes the light guide portion 1111 arranged so as to extend over the two photoelectric conversion portions 1011 and 1021 and the light guide portion 1112 arranged so as to extend over the two photoelectric conversion portions 1012, 1022 is also applicable. As illustrated in FIG. 5O, the light receiving element 1 includes the single light guide portion 111 arranged so as to extend over the plurality of photoelectric conversion portions 1011 and 1021. In addition, the light receiving element 1 also includes the single light guide portion 1121 arranged only on the single photoelectric conversion portion 1012 and the single light guide portion 1122 arranged only on the single photoelectric conversion portion 1022.

As illustrated in FIG. 5P, a direction of transfer from the photoelectric conversion portions 101 and 102 to the detection portion 105 and 106 may be non-parallel. As illustrated in FIG. 5Q, the direction of transfer from the photoelectric conversion portions 101 and 102 to the detection portion 105 and 106 may be opposite to each other. As illustrated in FIG. 5R, the single transfer gate 103 may be commonly provided on the plurality of photoelectric conversion portions 101 and 102 and the plurality of detection portion 105 and 106 corresponding thereto. As illustrated in FIG. 5S, the single detection portion 105 may be commonly provided on the plurality of photoelectric conversion portions 101 and 102 and the plurality of transfer gates 103 and 104 corresponding thereto.

Figure 6:
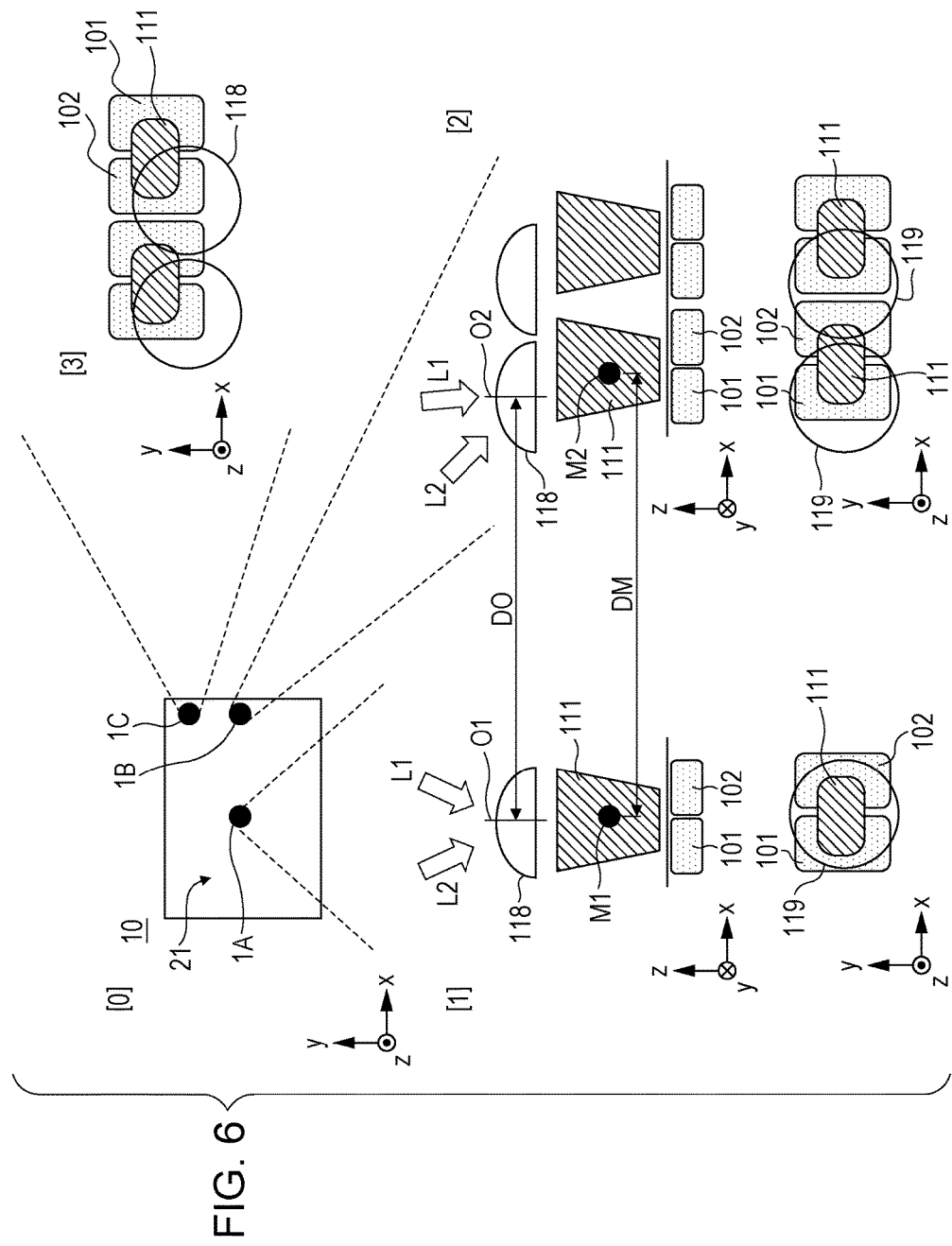
FIG. 6 is a schematic drawing illustrating an example of the photoelectric conversion apparatus.

As in this example, in the case where the light condensing portion 118 is arranged above (+Z side) of the light guide portion 111, a configuration in which an optical axis of the light condensing portion 118 is shifted from the separating portion 109 in the vicinity of the periphery of the light-receiving area of the photoelectric conversion apparatus 10 is also applicable. An example is illustrated in FIG. 6. The numeral 0 in FIG. 6 illustrates the light-receiving area 21. The numerals 1, 2, and 3 in FIG. 6 illustrate positional relationships among the light condensing portion 118, the light guide portion 111 and the photoelectric conversion portions 101 and 102 in the vicinity of a center in the vertical and lateral direction, in the vicinity of a right end at the center in the vertical direction, and in the vicinity of an end in a diagonal direction of the light-receiving area 21. The angle of incident light L extends obliquely from a point in the vicinity of the center of the photoelectric conversion apparatus 10 toward the vicinity of the periphery. With a configuration in which the array of the light condensing portion 118 is shifted gradually toward the center of the photoelectric conversion apparatus 10, sensitivity is improved in the entire area from the vicinity of the center to the vicinity of the periphery of the photoelectric conversion apparatus 10. In addition, the distribution to the two photoelectric conversion portions 101 and 102 with high degree of accuracy is also enabled. In the case of a solid-state image pickup apparatus having a focus detection performance, an improvement of the focus detection performance is also achieved.

For example, the plurality of light receiving elements 1 each include a first light receiving element 1A located at a central region of the light-receiving area 21, a second light receiving element 1B and a third light receiving element 1C located in the peripheral region of the light-receiving area 21. The central region is a segment which corresponds to the second row and the second column when the light-receiving area 21 is divided into nine segments in three rows and three columns, and the peripheral region corresponds to eight segments except for the central region. The second light receiving element 1B is located, for example, at the second row and the third column, and the third light receiving element 1C is located, for example, the first row and the third column. A distance DO between an optical axis O1 of the light condensing portion 118 of the first light receiving element 1A and an optical axis O2 of the light condensing portion 118 of the second light receiving element 1B is smaller than a distance between a gravity center M1 of the light guide portion 111 of the second light receiving element 1B and a gravity center M2 of the light guide portion 111 of the second light receiving element 1B (DM>DO). The above-described relationship applies also to the relationship between the first light receiving element 1A and the third light receiving element 1C. In other words, a distance between an optical axis of the light condensing portion 118 of the first light receiving element 1A and an optical axis of the light condensing portion 118 of the third light receiving element 1C is smaller than a distance DM between a gravity center M1 of the light guide portion 111 of the first light receiving element 1A and a gravity center of the light guide portion 111 of the third light receiving element 1C.

In a configuration illustrated in FIG. 6, the light condensing portion 118 is shifted toward the central region of the photoelectric conversion apparatus 10. However, a configuration in which the entire part is shifted to the same direction (for example, +Y-direction) in parallel is also applicable. For example, by shifting the light condensing portion 118 away from the transfer gate, the lost rate at the transfer gate is reduced, and a further improvement of sensitivity is achieved. A configuration in which not only the light condensing portion 118, but also the light guide portion 111 is shifted also achieves the same effects. In addition, a configuration in which not only the light condensing portion 118, but also the light guide portion 111 is shifted with respect to the light condensing portion 118 and the photoelectric conversion portions 101 and 102 also achieves the same effects.

The light guide portion 111 preferably has a cross-sectional shape having the maximum width in the X-direction in which the photoelectric conversion portions 101 and 102 are arranged is larger than the maximum width in the Y-direction orthogonal to the X-direction. For example, as illustrated in FIG. 7A, the maximum width of the light guide portion 111 in the X-direction is WX1 at the position Z1, WX2 at the position Z2, and WX3 at the position Z3. The maximum width of the light guide portion 111 in the Y-direction is WX1 at the position Z1, WX2 at the position Z2, and WX3 at the position Z3. The light guide portion 111 has a cross-sectional shape having the maximum width in the X-direction larger than the maximum width in the Y-direction in a plane (XY plane) parallel to the substrate 100. For example, a maximum width WX1 is larger than a maximum width WY1 at the position Z1 (WX1>WY1). In the same manner, a maximum width WX2 is larger than a maximum width WY2 at the position Z2 (WX2>WY2), and a maximum width WX3 is larger than a maximum width WY3 at the position Z3 (WX3>WY3).

The cross-sectional shape of the light guide portion 111 in the XY plane may be different depending on the distance from the substrate 100. The light guide portion 111 of this example has a cross-sectional shape having the maximum width in the X-direction is different from the maximum width in the Y-direction in a plane (XY plane) parallel to the substrate 100. For example, as regards the maximum width of the light guide portion 111 in the X-direction, the maximum width WX1 at the position Z1 is larger than the maximum width WX2 at the position Z2 (WX1>WX2), and the maximum width WY3 at the position Z3 is smaller than the maximum width WX2 at the position Z2 (WX2>WX3). As regards the maximum width of the light guide portion 111 in the Y-direction, the maximum width WY1 at the position Z1 is larger than the maximum width WY2 at the position Z2 (WY1>WY2), and the maximum width WY3 at the position Z3 is smaller than the maximum width WY2 at the position Z2 (WY2>WY3). At a certain position in the Z-direction, if the maximum width of the light guide portion 111 in the X-direction is not smaller than ±1% of the maximum width of the light guide portion 111 in the Y-direction, it can be said that the maximum width is significantly different. In order to achieve sufficient effects, the maximum width of the light guide portion 111 in the X-direction is preferably at least 1.1 times and, more preferably, at least 1.2 times the maximum width of the light guide portion 111 in the Y-direction at respective positions in the Z-direction.

Figure 7:
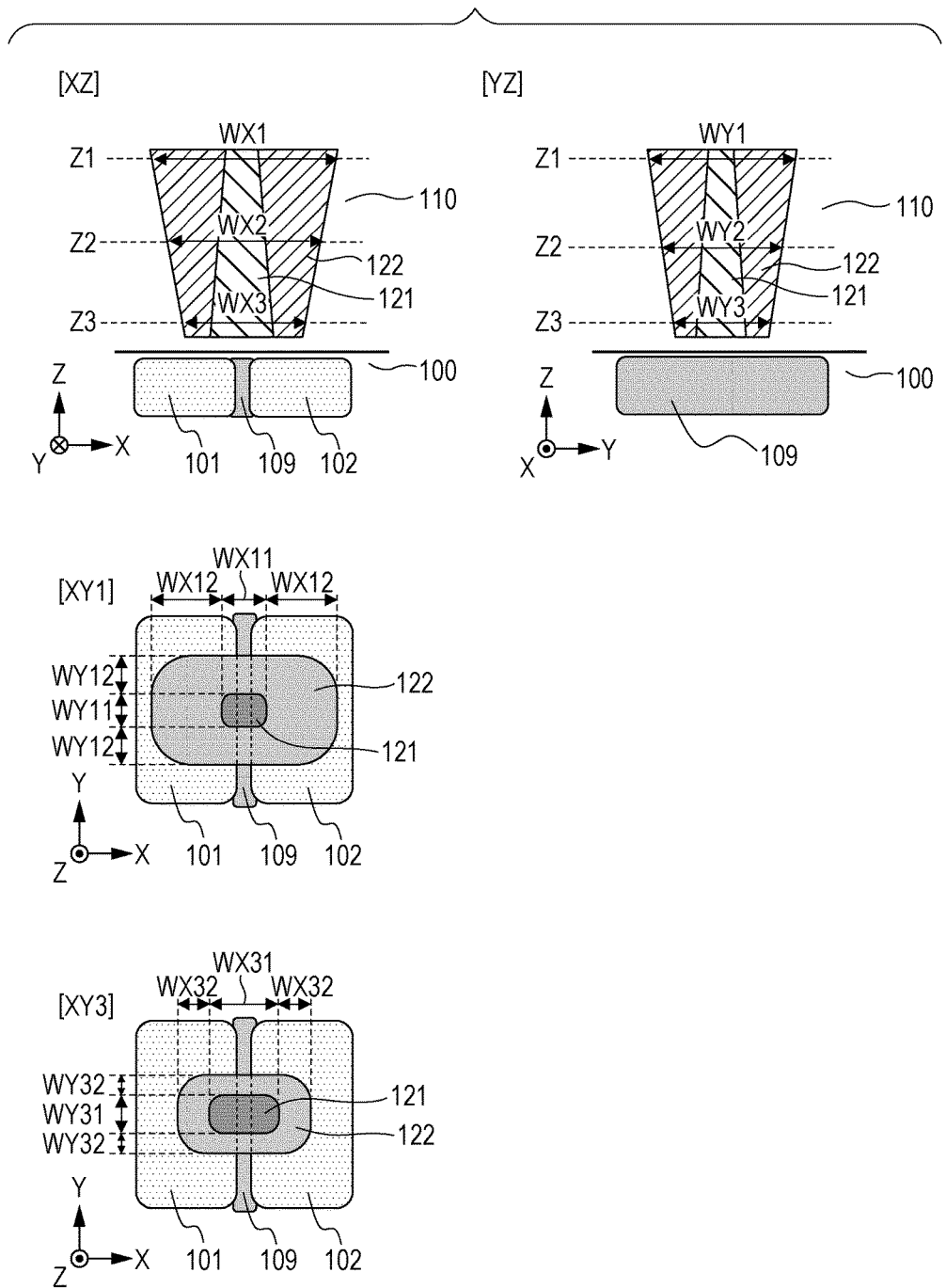
FIG. 7 is a schematic drawing illustrating an example of the light-receiving element.

As is understood from the comparison between the XY1 and XY2, and XZ and YZ in FIG. 7, the cross-sectional area of the XY plane of the light guide portion 111 decreases gradually as it approaches from the light incident direction toward the photoelectric conversion portions 101 and 102. In other words, the light guide portion 111 has a normal tapered shape toward the substrate 100. The cross sections of the light guide portion 111 at any of the position Z1, the position Z2, and the position Z3 have a shape having the maximum widths WX1, WX2, and WX3 in the X-direction larger than the maximum width WY1, WY2, and WY3 in the Y-direction.

For example, at the position Z1, the maximum width WX1 of the light guide portion 111 in the X-direction is on the order of 0.30 um to 10 um, the maximum width WY1 of the light guide portion 111 in the Y-direction is on the order of 0.25 to 9 um. At the position Z3, the maximum width WX2 of the light guide portion 111 in the X-direction is on the order of 0.25 um to 9 um, the maximum width WY2 of the light guide portion 111 in the Y-direction is on the order of 0.20 to 8 um. At the position Z2, a value between the maximum width at the position Z1 and the maximum width at the position Z3 may be employed.

In FIG. 7, an intermediate portion of the light guide portion 111, which is a portion overlapping with the separating portion 109 in the Z-direction, is indicated by dot lines. In a plane at a certain position in the Z-direction, the length (width) of the intermediate portion in the Y-direction is preferably smaller than the maximum width of the light guide portion 111 in the X-direction. The width of the intermediate portion is an important element to determine which one of the plurality of photoelectric conversion portions 101 and 102 light incident on the light guide portion 111 is to be distributed to. It is effective to reduce the width of the intermediate portion sufficiently for improving the light distributing accuracy.

The maximum width WX3 at the position Z3 of the light guide portion 111 in the X-direction is set to be shorter than a sum of the maximum widths of the two photoelectric conversion portions 101 and 102 arranged next to each other in the X-direction. In this configuration, light incident on the light guide portion 111 is allowed to be taken into the photoelectric conversion portion 101 or the photoelectric conversion portion 102 with a low loss.

In wave-optics point of view, light incident on the light guide portion 111 propagates while waving, so that an electric field intensity distribution is generated in the interior of the light guide portion 111. Here, portions having a high electric field intensity indicates that a large amount of light is present stochastically. At this time, the shape of light propagating in the light guide portion 111 (the shape of the electric field intensity distribution) depends on the shape of the light guide portion 111. When the maximum width of the light guide portion 111 is increased, likelihood of existence of light is increased. Therefore, the amount of light propagating in the direction having a larger maximum width is increased. The cross sections of the light guide portion 111 at Z1, Z2, and Z3 have a maximum width in the X-direction larger than the maximum width in the Y-direction, so that the amount of propagating light is relatively larger in the X-direction than in the Y-direction.

Therefore, as illustrated in FIG. 2B, when incident light L having vectors of +X component and −Z component enters obliquely, light is deflected to the +X side in the XY plane in the vicinity of the position Z1, which is near an entry of the light guide portion 111. In wave-optics point of view, the light incident obliquely propagates while being coupled with odd modes such as primary or third modes in addition to even modes such as zero-order or secondary modes. The oblique incident light tends to couple with the odd mode than vertical incident light. The odd mode is a wave guide mode parallel to the Z axis in the XZ plane, and having a shape of the electric field amplitude of an odd function with respect to an axis passing through the center of the light guide portion 111, and the even mode is the wave guide mode having the shape of the electric field amplitude in the form of an even function. The larger the maximum width of the light guide portion 111, the larger the number of modes to be coupled. Therefore, light incident thereon having an X-direction component tends to deflect in the X-direction. Light deflected to the +X direction at the inlet of the light guide portion 111 propagates in a state of being deflected to +X side as-is, and the light reaches the substrate 100. For example, light L incident from an angle having a vector of +X component and the −Z component mainly enters the photoelectric conversion portion 101 located on the +X side out of the two photoelectric conversion portions 101 and 102 arranged in the X direction. In the same manner, in the case of the incident light from an angle having the −X component and the −Z component, which is an opposite in the X-direction, major part of the incident light enters the photoelectric conversion portion 102. Consequently, light can be distributed accurately to the two photoelectric conversion portions 101 and 102 while maintaining the sensitivity. In addition, as in this example, if the light guide portion 111 having a cross-sectional shape having a maximum width in the X-direction larger than the maximum width in the Y-direction is employed, the accuracy of distribution not only with respect to oblique incident light, but also with respect to vertical incident light is improved.

As illustrated in FIGS. 8A, 8C, 8F, 8E and 8I, the width of a low refractive index part 121 being larger in the Y-direction than in the X-direction is advantageous in terms of an improvement of accuracy of the light distribution. However, as illustrated in FIGS. 8B, 8D, 8I, and 8J, the width of the low refractive index part 121 may be larger in the Y-direction than in the X-direction. As illustrated in FIG. 8G, the width of the low refractive index part 121 may be the same in the X-direction and the Y-direction. Like a mode illustrated in FIG. 8H, the light guide portion 111 may have a plurality of the low refractive index parts 121 as the low refractive index part separated from each other via the high refractive index part 122 as a high refractive index part. The low refractive index part 121 is not limited to be surrounded by the high refractive index part 122, but may be interposed only in the X-direction as in the modes illustrated in FIGS. 8E and 8I, or may be interposed only in the Y-direction as in the mode illustrated in FIG. 8J.

Figure 9A:
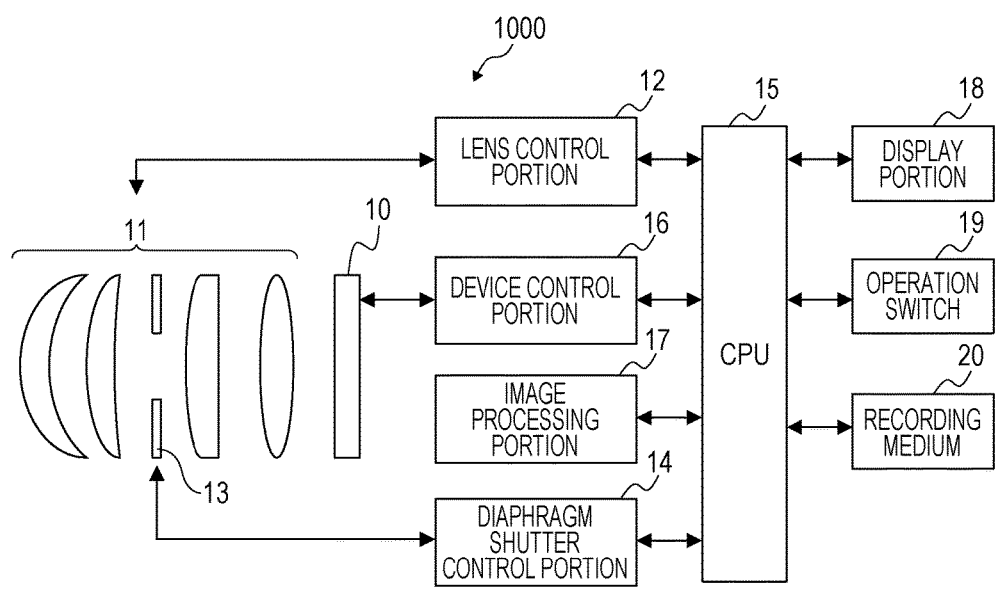
FIGS. 9A and 9B are schematic drawings illustrating examples of an image pickup system.

FIG. 9A illustrates a configuration of an image pickup system 1000 such as digital still cameras, video cameras, and information terminal with photographing function. The image pickup system 1000 is provided with an image-pickup lens as an image pickup optical system 11 configured to form images of photographic subjects mounted thereon. The image pickup optical system 11 including the image-pickup lens is controlled in focusing position by a lens control portion 12. A diaphragm shutter 13 is connected to a diaphragm shutter control portion 14, and has a diaphragm function that adjust a light amount by changing an opening diameter (varying an aperture value) and a shutter function that controls exposure time by opening and closing at the time of still image shooting. An image pickup surface of the photoelectric conversion apparatus 10 configured to perform photoelectric conversion of a photographic subject imaged by the image pickup optical system 11 is arranged in an image space of the image pickup optical system 11. The photoelectric conversion apparatus 10 includes a single or a plurality of photoelectric conversion portions having m in the horizontal direction, and n in the vertical direction of the light receiving elements, and an elementary colors mosaic filter having a Bayer layout is arranged with respect to the solid-state image pickup elements thereof, whereby a two-dimensional single plate color sensor is achieved.

A controller 15 is a camera CPU, and is responsible to control various operations of the camera. The camera CPU includes an operating portion, a ROM, a RAM, an A/D converter, a D/A converter, and a communication interface circuit. The camera CPU controls operations of respective portions in the camera in accordance with a computer program memorized in the ROM to cause these portions to execute a series of photographing operations such as AF, image-pickup, image processing, and recording including detection of focus state (focus detection) of a shooting optical system. The camera CPU corresponds to a computing device.

A device control portion 16 controls an operation of the photoelectric conversion apparatus 10, and A/D converts pixel signals (image pickup signals) output from the photoelectric conversion apparatus 10 and transmits the converted signal to the camera CPU. An image processing portion 17 performs image processing such as y conversion or color interpolation with respect to the A/D converted image pickup signals to generate image signals and further performs processing such as JPEG compression or the like on the image signals. A display portion 18 such as a liquid crystal display apparatus (LCD) or the like displays information relating to a shooting mode of the camera, a preview image before shooting, an image for checking after the shooting, and a focusing state at the time of focus detection. An operation switch 19 includes a power source switch, release (shooting trigger) switch, a zoom operation switch, and a shooting mode selection switch. A recording medium 20 is configured to record the shot images and may be demountably mountable.

Figure 9B:
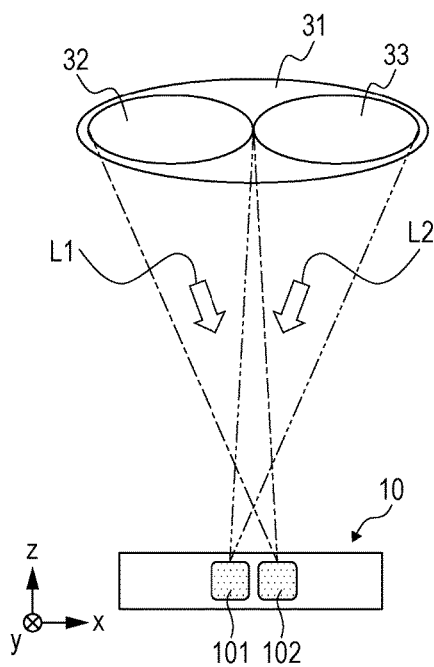

A method of focus detection (pupil division) in the light receiving element 1 having the two photoelectric conversion portions 101 and 102 will be described below. In an injection pupil 31 of an image pickup optical system illustrated in FIG. 9B, an X direction is a pupil dividing direction, and the respective areas of the divided injection pupil are pupil areas 32 and 33. A light flux that has passed through the pupil areas 32 and 33 is allocated to the two photoelectric conversion portions 101 and 102. The light receiving element 1 in this example having the two photoelectric conversion portions 101 and 102 in the X-direction includes a pupil dividing function configured to perform pupil division in the X-direction. Specifically, the photoelectric conversion portion 101 located on the −X side receives a light flux W2 (indicated by a double-dashed chain line) that has passed through the pupil area 32 on the −X side in FIG. 9B. The photoelectric conversion portion 102 located on the +X side receives a light flux W1 (indicated by an alternate chain line) that has passed through the pupil area 33 on the +X side in FIG. 9B. The focus detection is achieved by comparing the intensities of the light flux W1 and the light flux W2 by the photoelectric conversion portions 101 and 102.

Although the configuration for performing the focus detection with respect to the photographic subject having a luminance distribution in the X-direction has been described, the same configuration may be applied also to the Y-direction, whereby the focus detection in the Y-direction is also achieved in the case of the solid-state image pickup element having the photoelectric conversion portions 101 are arranged in the Y-direction.

The embodiment described thus far may be modified as needed without departing the technical thought of this disclosure.

According to this disclosure, accuracy of distribution of light to a plurality of photoelectric conversion portions while achieving a high sensitivity.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-114434, filed Jun. 2, 2014, which is hereby incorporated by reference herein in its entirety.

What is claimed is:

1. A photoelectric conversion apparatus having a semiconductor layer and a plurality of light-receiving elements, comprising:
   a plurality of photoelectric conversion portions provided in the semiconductor layer and included in one of the plurality of light-receiving elements;
   a separating portion provided in the semiconductor layer and located between the plurality of photoelectric conversion portions so that the separating portion and the plurality of photoelectric conversion portions are arranged in a first direction parallel to a light-receiving surface of the photoelectric conversion portions; and a light guide portion provided on the semiconductor layer and included in the light-receiving element, the light guide portion being surrounded by at least one insulation layer in a first plane parallel to the light-receiving surface and provided so as to overlap the plurality of photoelectric conversion portions in a second direction vertical to the light-receiving surface of the photoelectric conversion portions, wherein the light guide portion includes:

a high refractive index part having a refractive index higher than a refractive index of the insulation layer; and a low refractive index part having a refractive index higher than the refractive index of the insulation layer and lower than the refractive index of the high refractive index part, wherein the high refractive index part and the low refractive index part are arranged in at least the first plane, and the high refractive index part overlaps each of the plurality of photoelectric conversion portions in the second direction and the low refractive index part overlaps on the separating portion in the second direction.

2. The photoelectric conversion apparatus according to claim 1, wherein the high refractive index part has a width in the first plane and a width in a second plane parallel to the light-receiving surface and closer to the photoelectric conversion portion than the first plane, the width of the high refractive index part in the first plane is larger than the width of the high refractive index part in the second plane.

3. The photoelectric conversion apparatus according to claim 1, wherein the light-receiving element includes a wavelength selecting portion provided so as to extend over the plurality of photoelectric conversion portions.

4. The photoelectric conversion apparatus according to claim 3, wherein a width of the high refractive index part in a cross section of the light guide portion along the light-receiving surface of the photoelectric conversion portion is not smaller than $\lambda/4\sqrt{(n_2^2-n_0^2)}$, where $n_2$ is a refractive index of the high refractive index part, $n_0$ is a refractive index of the insulation layer, and $\lambda$ is a main transmitting wavelength of light transmitting through the wavelength selecting portion.

5. The photoelectric conversion apparatus according to claim 1, wherein a difference between the refractive index of the insulation layer and the refractive index of the low refractive index part is larger than a difference between the refractive index of the low refractive index part and the refractive index of the high refractive index part.

6. The photoelectric conversion apparatus according to claim 1, wherein the refractive index of the high refractive index part falls within a range from 1.025 times to 1.25 times the refractive index of the low refractive index part.

7. The photoelectric conversion apparatus according to claim 1, wherein the high refractive index part and the low refractive index part are formed of silicon nitride.

8. The photoelectric conversion apparatus according to claim 1, wherein the light guide portion has a non-rotational symmetrical shape in the first plane along the light-receiving surface of the photoelectric conversion portion.

9. The photoelectric conversion apparatus according to claim 1, wherein the light-receiving element includes a light condensing portion provided so that the light guide portion is arranged between the photoelectric conversion portions and the light condensing portion in the second direction.

10. An image pickup system comprising the photoelectric conversion apparatus according to claim 1, and a device configured to perform an image pickup and focus detection by a phase difference detection method on the basis of a signal obtained from the light-receiving element.

11. The photoelectric conversion apparatus according to claim 1, wherein the low refractive part has a width in the first plane and a width in a second plane parallel to the light-receiving surface between the photoelectric conversion portions and the first plane, the width in the first plane is smaller than the width in the second plane.

12. The photoelectric conversion apparatus according to claim 1, wherein the light guide portion has a width in the first plane and a width in a third direction in a second plane, the width in the first plane is larger than the width in the third direction in the second plane, the third direction is vertical to the first direction and the third direction, and the second plane begin parallel to the light-receiving surface between the photoelectric conversion portions and the first plane.

13. The photoelectric conversion apparatus according to claim 12, wherein the light guide portion has a width in the first direction in the first plane and a width in the third direction in a second plane.

14. A photoelectric conversion apparatus having a semiconductor layer and a plurality of light-receiving elements, comprising:

a plurality of photoelectric conversion portions provided in the semiconductor layer and included in one of the plurality of light-receiving elements;

a separating portion provided in the semiconductor layer and located between the plurality of photoelectric conversion portions so that the separating portion and the plurality of photoelectric conversion portions are arranged in a first direction parallel to a light-receiving surface of the photoelectric conversion portions; and a light guide portion provided on the semiconductor layer and included in the light-receiving element, the light guide portion being surrounded by an insulation film including at least one insulation layer and provided so as to extend over the plurality of photoelectric conversion portions, wherein the light guide portion includes:

a high refractive index part having a refractive index higher than the refractive index of the insulation layer, a low refractive index part having a refractive index higher than the refractive index of the insulation layer and lower than the refractive index of the high refractive index part, the high refractive index part is located on each of the plurality of photoelectric conversion portions and the lower refractive index part is located on the separating portion the low refractive index part is surrounded by the high refractive index part in a plane parallel to the light-receiving surface of the photoelectric conversion portion.

15. The photoelectric conversion apparatus according to claim 14, wherein the width of the high refractive index part in the first plane is larger than the width of the high refractive index part in the second plane between the photoelectric conversion portion and the first plane.

16. The photoelectric conversion apparatus according to claim 15, wherein the width of the low refractive part in the first plane is smaller than the width of the low refractive index in the second plane.

17. An image pickup system comprising:
the photoelectric conversion apparatus according to claim 14; and
a device configured to perform an image pickup and focus detection by a phase difference detection method on the basis of a signal obtained from the light-receiving element.

18. A photoelectric conversion apparatus having a plurality of light-receiving elements, comprising:
a plurality of photoelectric conversion portions included in a light-receiving element of the plurality of light-receiving elements;
a separating portion located between the plurality of photoelectric conversion portions;
a light condensing portion provided so as to extend over the photoelectric conversion portions; and
a light guide portion surrounded by an insulation film including at least one insulation layer and arranged between the plurality of photoelectric conversion portions,
wherein the light guide portion includes:
a high refractive index part having a refractive index higher than a refractive index of the insulation layer; and
a lower refractive index part having a refractive index higher than the refractive index of the insulation layer and lower than the refractive index of the high refractive index part;
the high refractive index part is located on each of the plurality of photoelectric conversion portions and the low refractive index part is located on the separating portion;
the light-receiving element includes a first light-receiving element positioned at a central region of a light-receiving area in which the light-receiving elements are arrayed;
and a second light-receiving element positioned in a peripheral region of the light-receiving area, and
wherein a distance between a gravity center of the light condensing portion of the first light-receiving element and a gravity center of the light condensing portion of the second light-receiving element is smaller than a distance between a gravity center of the light guide portion of the first light-receiving element and a gravity center of the light guide portion of the second light-receiving element.

19. The photoelectric conversion apparatus according to claim 18, wherein the low refractive index part has a width in a first plane parallel to a light-receiving surface of the photoelectric conversion portion and a width in a second plane parallel to the light-receiving surface and closer to the photoelectric conversion portion, the width of the low refractive index part in the first plane is smaller than the width of the low refractive index part in the second plane.

20. An image pickup system comprising:
the photoelectric conversion apparatus according to claim 18, and
a device configured to perform an image pickup and focus detection by a phase difference detection method on the basis of a signal obtained from the light-receiving element.

* * * * *